United States Patent
Ciccarelli et al.

(10) Patent No.: US 7,463,067 B2
(45) Date of Patent: Dec. 9, 2008

(54) SWITCH BLOCK FOR FPGA ARCHITECTURES

(75) Inventors: Luca Ciccarelli, Rimini (IT); Andrea Lodi, Castel S. Pietro (IT); Roberto Giansante, Pescara (IT); Luca Magagni, Bologna (IT); Roberto Canegallo, Rimini (IT); Roberto Guerrieri, Bologna (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/537,781

(22) Filed: Oct. 2, 2006

(65) Prior Publication Data

US 2007/0085563 A1 Apr. 19, 2007

Related U.S. Application Data

(60) Provisional application No. 60/722,672, filed on Sep. 30, 2005.

(51) Int. Cl.
*H03K 19/094* (2006.01)
(52) U.S. Cl. .................................... 326/113; 326/98
(58) Field of Classification Search ............. 326/95–98, 326/112–113, 119, 121
See application file for complete search history.

(56) References Cited

U.S. PATENT DOCUMENTS

| | | | |
|---|---|---|---|
| 6,768,338 B1* | 7/2004 | Young et al. | 326/44 |
| 6,798,270 B1* | 9/2004 | Bauer | 327/408 |
| 6,949,951 B1* | 9/2005 | Young et al. | 326/37 |
| 7,215,141 B2* | 5/2007 | Lewis | 326/41 |
| 2004/0008056 A1* | 1/2004 | Kursun et al. | 326/96 |
| 2005/0007153 A1* | 1/2005 | Ding et al. | 326/98 |
| 2007/0085563 A1* | 4/2007 | Ciccarelli et al. | 326/41 |
| 2007/0279088 A1* | 12/2007 | Ciccarelli et al. | 326/38 |

OTHER PUBLICATIONS

Anderson et al., Active Leakage Power Optimization for FPGAs, IEEE Transactions on Computer-Aided Design of Integrated Circuits and Systems, Mar. 2006, pp. 423-437, vol. 25, No. 3.
Rahman et al., Evaluation of Low-Leakage Design Techniques for Field Programmable Gate Arrays, FPGA'04, Feb. 22-24, 2004, pp. 23-30, 2004, Monterey, California.
Wei et al., Design and Optimization of Low Voltage High Performance Dual Threshold CMOS Circuits, DAC 98, Jun. 15-19, 1998, pp. 489-494, San Francisco, California.
Lodi et al., A Pipelined Configurable Gate Array for Embedded Processors, FPGA'03, Feb. 23-25, 2003, pp. 21-30, Monterey, California.

* cited by examiner

*Primary Examiner*—James H. Cho
*Assistant Examiner*—Jason Crawford
(74) *Attorney, Agent, or Firm*—Lisa K. Jorgenson; E. Russell Tarleton; Seed IP Law Group PLLC

(57) ABSTRACT

A switch block for FPGA architectures combining hardware and software techniques in order to reduce both active and standby leakage power.

40 Claims, 9 Drawing Sheets

SWITCH BLOCK FOR FPGA ARCHITECTURES

BACKGROUND OF THE INVENTION

1. Field of the Invention

The present invention relates to a switch block for FPGA architectures.

2. Description of the Related Art

As it is well known, technology scaling is leading to an exponential increase in integrated circuit leakage current, such that below 90 nm static power could be the dominant factor in energy consumption.

In particular, configurable structures such as FPGA (Field-Programmable Gate Arrays) architectures are affected more heavily than other devices such as ASICs by this problem, since they require many more transistors to support their main feature, the reconfigurability.

Indeed, configurable logic structures have become a valid alternative to ASICs because of the provided software programmability which reduces the design cycle, while density and running frequency greatly increase. It is well known that this flexibility is achieved at the cost of a larger silicon area occupation to accommodate the logic blocks that realize reconfigurability.

However, as technology scales the area constraint is becoming less restrictive, while the large number of integrated transistors in FPGA architectures is still a source of higher energy consumption of such architectures than the ASIC ones.

Since reconfigurable computing is a promising technology for wireless applications where systems need to support a variety of changing communication protocols, the power consumption constraint is becoming the main issue that could prevent FPGA architectures from being widely used in this field.

A typical configuration of a FPGA architecture is schematically shown in FIG. 1 and globally indicated with 1. The FPGA architecture 1 essentially comprises a plurality of programmable logic elements 2 arranged in a matrix-like configuration, commonly indicated as gate arrays, each of such programmable logic elements 2 being connected, by means of a plurality of local connections 3, to an interconnection network 4, in turn comprising a plurality of horizontal interconnection lines 4a and vertical interconnection lines 4b.

As schematized in the figure, each programmable logic element 2 of the gate array essentially comprises one or more computational blocks 5 such as look-up tables, ALUs etc, having a plurality of inputs and being connected to an output through a multiplexer 6 having in turn an input connected to a memory element 7.

In particular, the interconnection network 4 allows to reconfigure the FPGA architecture 1, changing the operation thereof.

FIG. 2 schematically shows a FPGA architecture 1, depicted in island-style, and comprising a switch matrix 9 of switch blocks for connecting a plurality of connection lines.

In particular, the figure shown how the programmable logic element 2 is connected to a horizontal connection block 8a and to a vertical connection block 8b in turn connected to the switch matrix 9, in turn comprising a plurality of switch blocks 10.

When power consumption of a FPGA architecture 1 is considered, it is immediately evident that a large part of the device area is often left completely unused when a specific circuit is mapped, and its power consumption is useless.

Several studies have been conducted on dynamic power reduction for FPGA architectures. In particular, the problem of leakage consumption evaluating different Hw/Sw techniques has been described by Anderson et al in the article entitled: "Active leakage Power Optimization for FPGA", FPGA2004, Feb. 22-24, 2004 as well as by Rahman et al. in the article entitled: "Evaluation of Low-Leakage Design Techniques for Field-Programmable Gate Arrays", FPGA2004, Feb. 22-24, 2004.

As a matter of fact, the fraction of power consumption due to leakage current in FPGA architectures is rapidly increasing as technology advances. This is mainly due to the threshold voltage scaling which leads to an exponential increase in the subthreshold leakage.

Since leakage generates static power consumption which depends on the number of integrated transistors, FPGA architectures will be suffering from this problem even more than other devices.

As already pointed out, most of the transistors provided for flexibility purposes in a FPGA are left unused when implementing a circuit. These parts of the configurable device do not present dynamic power consumption but contribute to increased energy dissipation, having a static subthreshold current.

Since the percentage of total power dissipation due to leakage depends on the number of unused resources, in FPGA architectures the leakage power consumption can become relevant and energy efficiency can be deeply affected.

A common way to tackle this problem is to use high threshold transistors, since leakage depends exponentially on the threshold voltage. In fact the leakage current of a high threshold transistor is about two orders of magnitude lower than a low threshold transistor being equivalent in terms of area and working conditions. However this technique significantly affects delays and could be used only for non-timing critical circuits.

When adopting the above described dual threshold approach to the design of a circuit, as described for example by Wei et al. in the article entitled: "Design and Optimization of Low Voltage High Performance Dual Threshold", DAC1998, 1998, an analysis of the criticality of the blocks composing the circuit needs to be carried out. In particular in the case of a FPGA architecture, it can be noticed that configuration memory elements, usually RAM cells, are not directly involved with signal transmission delay. Therefore all such static RAM cells can be implemented using slow high threshold transistors in order to save energy.

On the other hand switch blocks, connect blocks, logic blocks and lookup-tables (LUTs) contribute to delays in signal propagation. Therefore these blocks should be carefully studied in order to use high-speed low threshold (Vtl) transistors on the critical delay paths, and high threshold transistors (Vth) for the other components.

This technique has been extensively applied in the design of a PiCoGA configurable device, as described by Lodi et al. in the article entitled: "A Pipelined Configurable Gate Array for Embedded Processors", Proceedings of the 11th ACM/SIGDA International Symposium on FPGAs, February 2003. Such a PiCoGA configurable device has been implemented on silicon in 0.13 μm STMicroelectronics technology.

Though the above described dual threshold approach has been adopted, it has been verified that yet considerable power dissipation due to leakage remains, which has been measured to be more than 25 mW for a PiCoGA configurable device area occupation of 11 mm$^2$. This is a static consumption and scaling to technology below 100 nm will considerably increase it.

Transistors inside the logic block, LUTs and input connect blocks have smaller size since they drive only short local wires. On the other hand, switch blocks and output connect blocks drive routing wires crossing over several tiles, therefore the parasitic capacitive load involved is considerable. Since signal propagation through programmable interconnections is responsible for most delays in FPGA architectures, large buffers inside switch blocks are necessary to avoid a significant degradation of timing performance.

A switch block 10 realized according to the known designs is shown in FIG. 3. In particular, this figure shown a circuit schematic corresponding to a traditional implementation of a tri-state buffered switch optimized for delays, also indicated as Switch0.

The switch block 10 realizes the connection between a first line L0, a second line L1, a third line L2 and a fourth line L3, as shown in FIG. 4.

To do this, the switch block 10 comprises:

a first pass-transistor N0 connected between the first line L0 and a first internal node net0;

a second pass-transistor N1 connected between the second line L1 and the first internal node net0;

a third pass-transistor N2 connected between the third line L2 and the first internal node net0; and a fourth pass-transistor N6 connected between the fourth line L3 and a second internal node net2.

In the example shown in the FIG. 4, the pass-transistors N0-N2 and N6 are of the NMOS type.

The switch block 10 also includes a first inverter P1-N4 and a second inverter P2-N5, inserted between the first and second internal nodes, net0 and net2, and interconnected at a third internal node net1.

In particular, the first inverter comprises a PMOS transistor P1 and an NMOS transistor N4 connected, in series to each other, between a first and a second voltage reference, in particular a supply voltage reference VDD and ground GND. The first inverter transistors P1 and N4 have their gate terminals connected to each other and to the first internal node net0 and the common drain terminals connected to the third internal node net1.

In a same manner, the second inverter has a PMOS transistor P2 and an NMOS transistor N5 connected, in series to each other, between the supply voltage reference VDD and ground GND, the second inverter transistors P2 and N5 having their gate terminals connected to each other and to the third internal node net1 and the common drain terminals connected to the second internal node net2.

Finally, the switch block 10 includes a pull down transistor N3 inserted between the first internal node net0 and ground GND and a pull up transistor P0 inserted between the supply voltage reference VDD and the first internal node net0, the pull up transistor P0 having its gate terminal connected to the third internal node net1.

In particular, the pull down transistor N3 is of the NMOS type and the pull up transistor P0 is of the PMOS type, both being high-voltage or Vth transistors (as indicated by a thicker gate line in the figure), all other transistors being low-voltage or Vtl transistors.

According to this design, only Vtl transistors are in the signal path of the switch block 10 in order to minimize delays.

In order to analyze the leakage current of inactive circuit elements, the switch block 10 has to be turned off. All the pass-transistors are turned off and the pull down transistor N3 is turned on, so that the first and second internal nodes net0 and net2 are pulled down. In particular, the pull down transistor N3 is driven by a driving signal, which corresponds to the inverted driving signal of the fourth pass-transistor N6.

The leakage current associated with the switch block 10 is composed of a fixed contribution due to subthreshold current from the transistors P1 to the transistor N4 of the first inverter and from the transistor P2 to the transistor N5 of the second inverter, and of a variable contribution. This variable contribution is due to the leakage current passing through the pass-transistors N0, N1, N2 and N6, and depends on the difference of voltage levels between source and drain of the pass-transistors themselves and thus on the external signals applied to the lines L0-L3.

There are five possible configurations for the external signals applied to the lines L0 ... L3, each of them assuming a value 0 or a value equal to VDD−Vtl, being VDD the power voltage reference value and Vtl the threshold voltage value of a low-voltage transistor.

It can be seen that the leakage power consumption of the switch block 10 is highest when all the external lines assume a high value (difference at the terminals of pass-transistors equal to VDD−Vtl), and it is lowest in the opposite condition (no difference at the terminals of pass-transistors implies no leakage current).

A configuration choice providing a low value on the first and second internal nodes net0 and net2 minimizes the average leakage power due to the variable component.

In fact if these nodes are pulled down, the difference between internal nodes (net0 and net2) and external lines (L0 ... L3) would be equal to Vtl in the best condition, while the difference would be the full logic swing (VDD) in the worst configuration.

Since the probability to have a high or low value on the external lines L0 ... L3 is equal, on average the pull-down configuration of the switch block 10 shown in FIG. 3 reduces the leakage dissipation variable component, while the fixed one is nearly the same in both cases.

The traditional scheme of the switch block 10 as shown in FIG. 3 can be modified in order to save leakage current while keeping good timing performance, such modification being based on the consideration that signal delay is mainly due to the transition time of the two inverters when the input signal changes.

A modified switch block 10 (also indicated as Switch0−Vth pass-trans) can be thus obtained by using Vth transistors also for the pass-transistors N0, N1, N2 and N6, while Vtl transistors are used for the inverters.

It is also possible to modify the switch block 10 in order to minimize the leakage current by using all Vth transistors (also indicated as Switch0−all Vth trans). It is clear that this solution certainly reduces the leakage power consumption drastically, but at the cost of introducing many slow transistors on the signal path delay.

So, other solutions need to be found in order to apply reconfigurable computing to low-power portable environments.

BRIEF SUMMARY OF THE INVENTION

The disclosed embodiments of the present invention are directed to a switch block for FPGA architectures having structural and functional characteristics, which provide reduced static consumption of the architecture as a whole without affecting the operational speed thereof, and in this way overcoming the limits that still affect the devices realized according to the known designs.

The switch block connects a first, second, third and fourth lines and includes:

a first pass-transistor connected between the first line and a first internal node;

a second pass-transistor connected between the second line and the first internal node;

a third pass-transistor connected between the third line and the first internal node;

a fourth pass-transistor connected between the fourth line and a second internal node;

a first and a second inverters, inserted between the first and the second internal node, interconnected at a third internal node;

the first inverter including a PMOS transistor and an NMOS transistor connected, in series to each other, between the first voltage reference and a fourth internal node, the transistors of the first inverter having their gate terminals connected to each other and to the first internal node and common drain terminals connected to the third internal node;

the second inverter including a PMOS transistor and an NMOS transistor connected, in series to each other, between the first voltage reference and the fourth internal node, the transistors of the second inverter having their gate terminals connected to each other and to the third internal node and common drain terminals connected to the second internal node wherein the fourth internal node is connected to a second voltage reference by means of a pull-down block.

A further embodiment is directed to a switch block connecting a first, second, third and fourth lines and comprising:

a first pass-transistor connected between the first line and a first internal node;

a second pass-transistor connected between the second line and the first internal node;

a third pass-transistor connected between the third line and the first internal node;

a fourth pass-transistor connected to the fourth line;

a first and a second inverters, inserted between the first internal node and the fourth line, interconnected at a second internal node;

the first inverter comprising a PMOS transistor and an NMOS transistor connected, in series to each other, between the first and second voltage references, the transistors of the first inverter having their gate terminals connected to each other and to the first internal node and common drain terminals connected to the second internal node;

the second inverter including a PMOS transistor and an NMOS transistor connected, in series to each other, between the first and second voltage references, the transistors of the second inverter having their gate terminals connected to each other and to the second internal node; and wherein the NMOS transistor of the second inverter is directly connected to the fourth line and the PMOS transistor of the second inverter is connected to the fourth pass-transistor.

A still further embodiment of the invention relates to a switch block connecting a first, second, third and fourth lines and comprising:

a first pass-transistor connected between the first line and a first internal node;

a second pass-transistor connected between the second line and the first internal node;

a third pass-transistor connected between the third line and the first internal node;

a fourth pass-transistor connected to the fourth line;

a first and a second inverters, inserted between the first internal node and the fourth line, interconnected at a second internal node;

the first inverter having a PMOS transistor and an NMOS transistor connected, in series to each other, between the first voltage reference and a third internal node, the transistors of the first inverter having their gate terminals connected to each other and to the first internal node and common drain terminals connected to the second internal node;

the second inverter including a PMOS transistor and an NMOS transistor connected, in series to each other, between the first voltage reference and the third internal node, the transistors of the second inverter having their gate terminals connected to each other and to the second internal node wherein the NMOS transistor of the second inverter is directly connected to the fourth line and the PMOS transistor of the second inverter is connected to the fourth pass-transistor; and wherein the third internal node is connected to a second voltage reference by means of a pull-down block.

Another embodiment of the invention is directed to a switch block connecting a first, second, third and fourth lines and further including:

a first pass-transistor connected between the first line and a first internal node;

a second pass-transistor connected between the second line and the first internal node;

a third pass-transistor connected between the third line and the first internal node;

a fourth pass-transistor connected to the fourth line;

a first and a second inverters, inserted between the first internal node and the fourth line, interconnected at a second internal node;

the first inverter having a PMOS transistor and an NMOS transistor connected, in series to each other, between the first voltage reference and a third internal node, the transistors of the first inverter having their gate terminals connected to each other and to the first internal node and common drain terminals connected to the second internal node;

the second inverter including a PMOS transistor and an NMOS transistor connected, in series to each other, between the first voltage reference and the third internal node, the transistors of the second inverter having their gate terminals connected to each other and to the third internal node;

wherein the NMOS transistor of the second inverter is directly connected to the fourth line and the PMOS transistor of the second inverter is connected to the fourth pass-transistor;

wherein the third internal node is connected to a second voltage reference by means of a pull-down block; and wherein the switch block further includes a driving block connected to the gate terminals of the pass-transistors as well as to the pull-down block.

Still another embodiment of the invention relates to a switch block connecting first, second, third and fourth lines and having:

a first pass-transistor connected between the first line and a first internal node;

a second pass-transistor connected between the second line and the first internal node;

a third pass-transistor connected between the third line and the first internal node;

a fourth pass-transistor connected to the fourth line;

a first and a second inverters, inserted between the first internal node and the fourth line, interconnected at a second internal node;

the first inverter including a PMOS transistor and an NMOS transistor connected, in series to each other, between the first and second voltage references, the transistors of the first inverter having their gate terminals connected to each other and to the first internal node and common drain terminals connected to the second internal node;

the second inverter having a PMOS transistor and an NMOS transistor connected, in series to each other, between the first and second voltage references, the transistors of the second inverter having their gate terminals connected to each other and to the second internal node;

wherein the NMOS transistor of the second inverter is directly connected to the fourth line and the PMOS transistor of the second inverter is connected to the fourth pass-transistor; and wherein the switch block further comprises a driving block connected to the gate terminals of the pass-transistors and a body biasing block connected to the body terminal of the NMOS transistor of the second inverter.

Another embodiment of the invention is directed to a switch block connecting a first, second, third and fourth lines and including:

a first pass-transistor connected between the first line and an input internal node;

a second pass-transistor connected between the second line and the input internal node;

a third pass-transistor connected between the third line and the input internal node;

a fourth pass-transistor connected to the fourth line;

a first and a second inverters, inserted between a first internal node and the fourth line, interconnected at a second internal node;

the first inverter having a PMOS transistor and an NMOS transistor connected, in series to each other, between the first and second voltage references, the transistors of the first inverter having their gate terminals connected to each other and to a first internal node and common drain terminals connected to the second internal node;

the second inverter having a PMOS transistor and an NMOS transistor connected, in series to each other, between the first and second voltage references, the transistors of the second inverter having their gate terminals connected to each other and to the second internal node wherein the NMOS transistor of the second inverter is directly connected to the fourth line and the PMOS transistor of the second inverter is connected to the fourth pass-transistor; and wherein the switch block further comprises an additional input transistor inserted between the input and the first internal nodes.

The characteristics and advantages of the switch blocks according to the invention will be apparent from the following description of embodiments thereof given by way of indicative and non limiting example with reference to the annexed drawings.

DETAILED DESCRIPTION OF THE INVENTION

Figure 5:
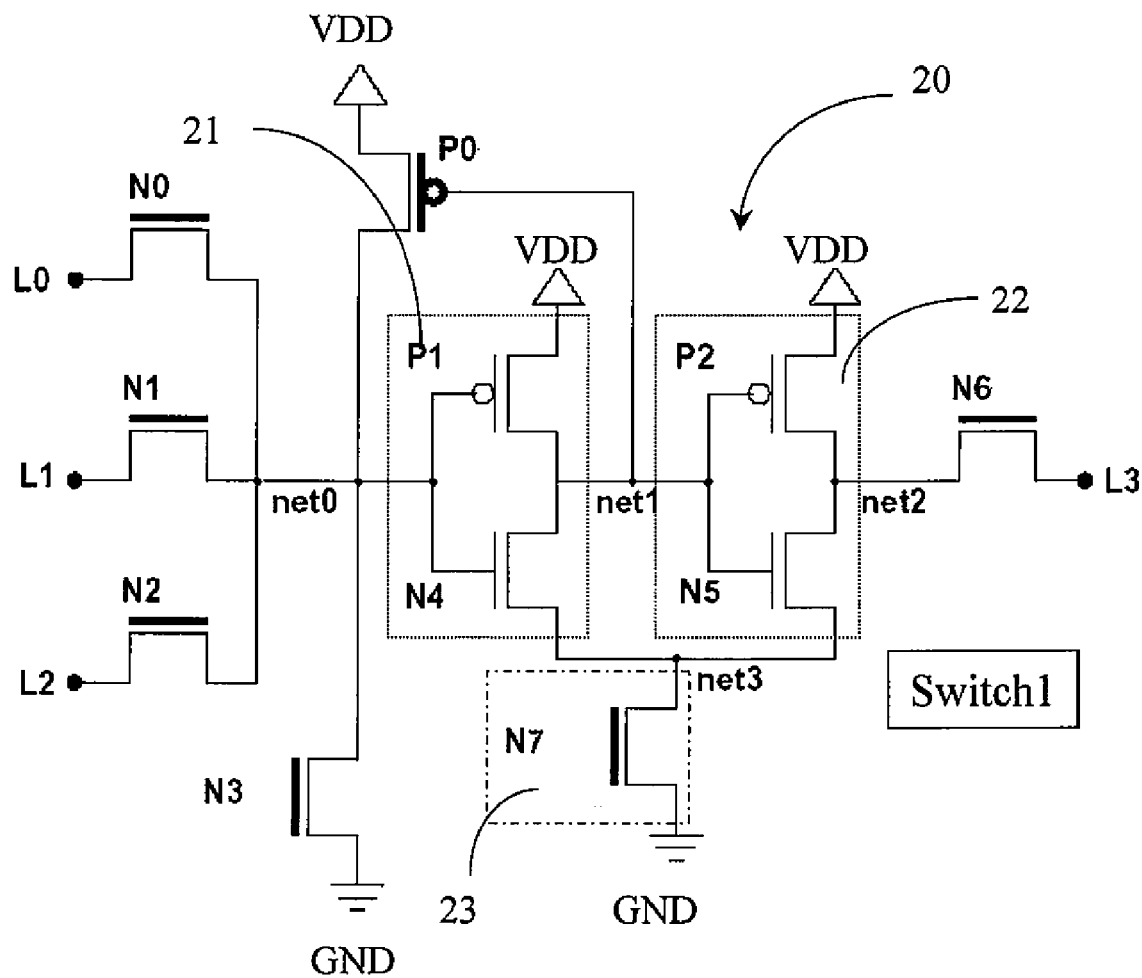
FIG. 5 schematically shows a switch block for FPGA architectures realized according to a first embodiment of the present invention.

With reference to such figures, and in particular to FIG. 5, a switch block realized according to a first embodiment of the invention is schematically shown and globally indicated as 20 or Switch1.

For structurally or functionally equal elements with respect to the switch block described in the Background section, the same reference numbers will be applied.

As already described, the switch block 20 (Switch1) realizes the connection between a first line L0, a second line L1, a third line L2 and a fourth line L3 and includes:

a first pass-transistor N0 connected between the first line L0 and a first internal node net0;

a second pass-transistor N1 connected between the second line L1 and the first internal node net0;

a third pass-transistor N2 connected between the third line L2 and the first internal node net0; and a fourth pass-transistor N6 connected between the fourth line L3 and a second internal node net2.

In the example shown in FIG. 5, the pass-transistors N0-N2 and N6 are of the NMOS type.

The switch block 20 (Switch1) also includes a first inverter 21 and a second inverter 22, inserted between the first net0 and the second internal node net2 and interconnected at a third internal node net1.

Advantageously according to this embodiment of the invention, the first and second inverters, 21 and 22, are connected to a first voltage reference, in particular a supply voltage reference VDD and to a fourth internal node net3, in turn connected to a second voltage reference, in particular ground GND, by means of a pull-down block 23.

The first inverter 21 is formed of a PMOS transistor P1 and an NMOS transistor N4 connected, in series to each other, between the supply voltage reference VDD and the fourth internal node net3. The transistors P1 and N4 of the first inverter 21 have their gate terminals connected to each other and to the first internal node net0 and the common drain terminals connected to the third internal node net1.

In a same manner, the second inverter 22 is formed of a PMOS transistor P2 and an NMOS transistor N5 connected, in series to each other, between the voltage supply reference VDD and the fourth internal node net3. The transistors P2 and N5 of the second inverter 22 have their gate terminals connected to each other and to the third internal node net1 and the common drain terminals connected to the second internal node net2.

Finally, the switch block 20 (Switch1) has a pull down transistor N3 inserted between the first internal node net0 and ground GND and a pull up transistor P0 inserted between the supply voltage reference VDD and the first internal node net0, the pull up transistor P0 having its gate terminal connected to the third internal node net1.

In particular, the pull down transistor N3 is of the NMOS type and the pull up transistor P0 is of the PMOS type, both being high-voltage or Vth transistors (as indicated by a thicker gate line in the figure).

In the example shown in FIG. 5, the pull-down block 23 has an additional pull-down transistor N7 inserted between the fourth internal node net3 and ground GND. In particular, the additional pull down transistor N7 is a high-voltage NMOS transistor.

Also, advantageously according to the invention, the pass-transistors N0-N3 are high-voltage or Vth transistors.

In this way, the switch block 20 (Switch1) shows a reduced leakage consumption and minimum delay values which respect to the known ones.

In particular, it should be emphasized that the high-voltage additional pull-down transistor N7, also called footer, is turned off when the switch block 20 is inactive. In this way, the pull down block 23 allows to have, in the idle state, all paths between the supply voltage reference VDD and ground GND passing through a turned off high-threshold transistor, the footer transistor N7 indeed.

Figure 1:
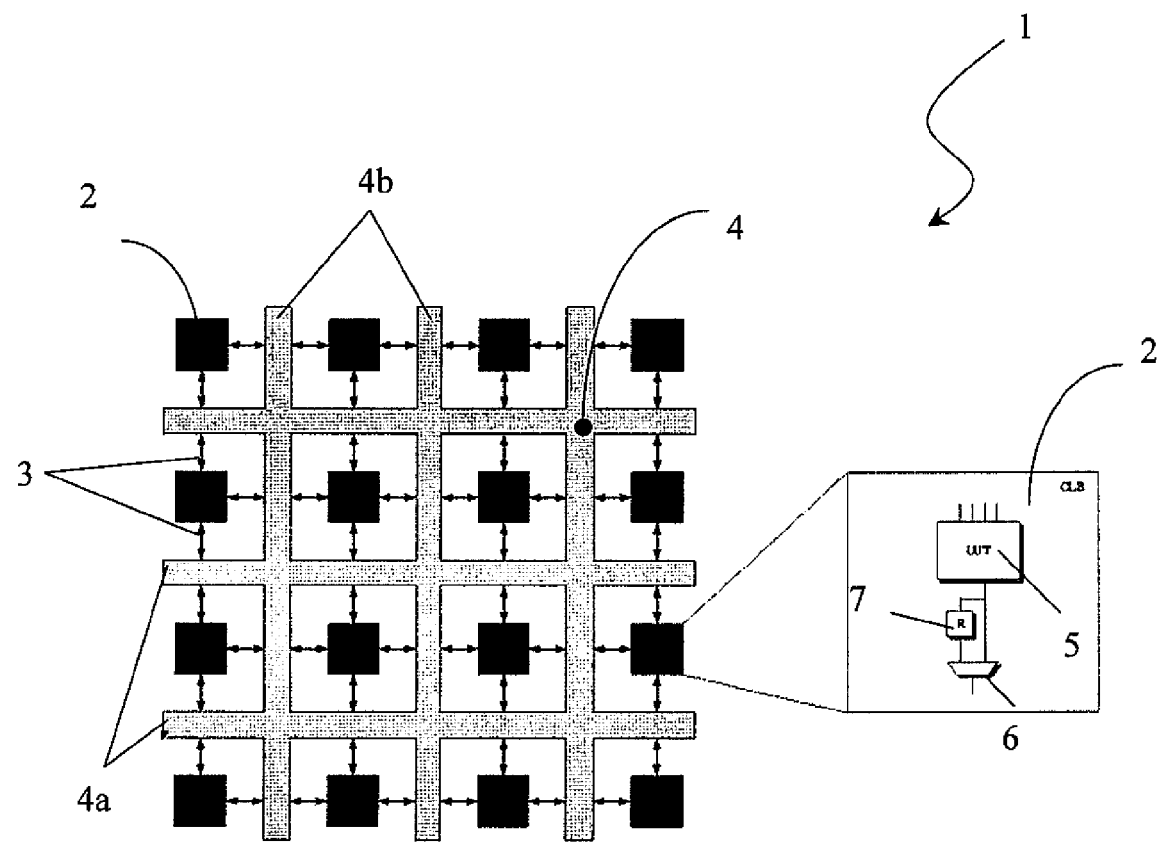
FIG. 1 schematically shows a FPGA architecture realized according to the known designs.
Figure 2:
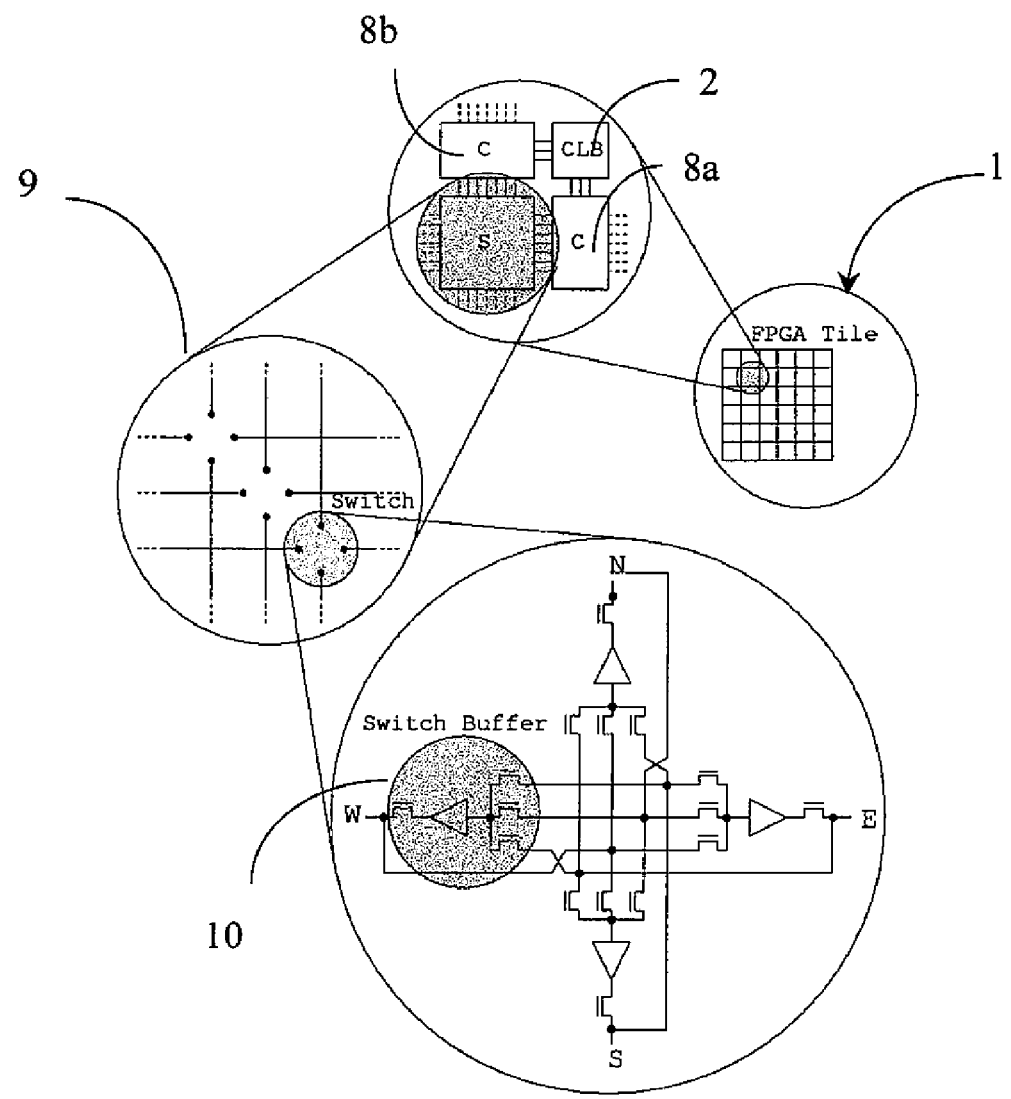
FIG. 2 schematically shows in an island style a FPGA architecture realized according to the known designs.
Figure 3:
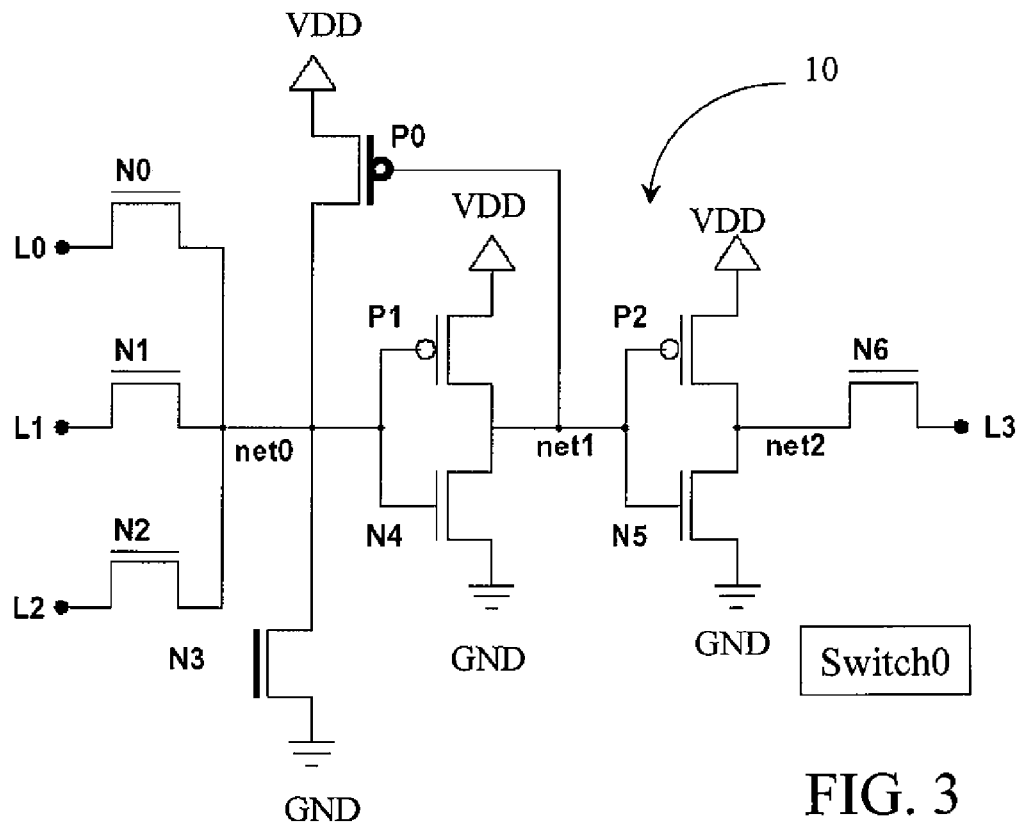
FIG. 3 schematically shows a switch block for FPGA architectures realized according to the known designs.

It has been seen that the leakage power of the switch block 20 (Switch1) according to the first embodiment of the invention is thus reduced of about two orders of magnitude with respect to the switch block (Switch0) according to the known designs, as shown in FIG. 3, also in case of high-voltage pass-transistors (Switch0–Vth pass-trans). The power consumption of the switch block 20 (Switch1) is similar to the one of the known switch block (Switch0) when forming all high voltage transistors (Switch0–all Vth trans).

In this case, however, good timing performance is achieved, since the buffer stage of the switch block 20 (Switch1), substantially including the first and second inventers 21 and 22, is mainly implemented with fast low-voltage transistors.

In particular it should be remarked that the footer transistor N7 is always on when the buffer stage is active and that it does not switch with the input signals.

The introduction of the footer transistor N7 reduces the driving factor of the pull down path of the buffer stage of the switch block 20 (Switch1). In fact, compared with the known schemes, the pull down path of the switch block 20 (Switch1) according to the first embodiment of the invention has a series of three transistors (N5, N6 and N7) instead of two as for the known solution as shown in FIG. 3 (Switch0).

Also, advantageously according to the invention, a second embodiment of the switch block 20 is provided, showing an enhanced driving factor with respect to the Switch1 scheme.

Figure 6:
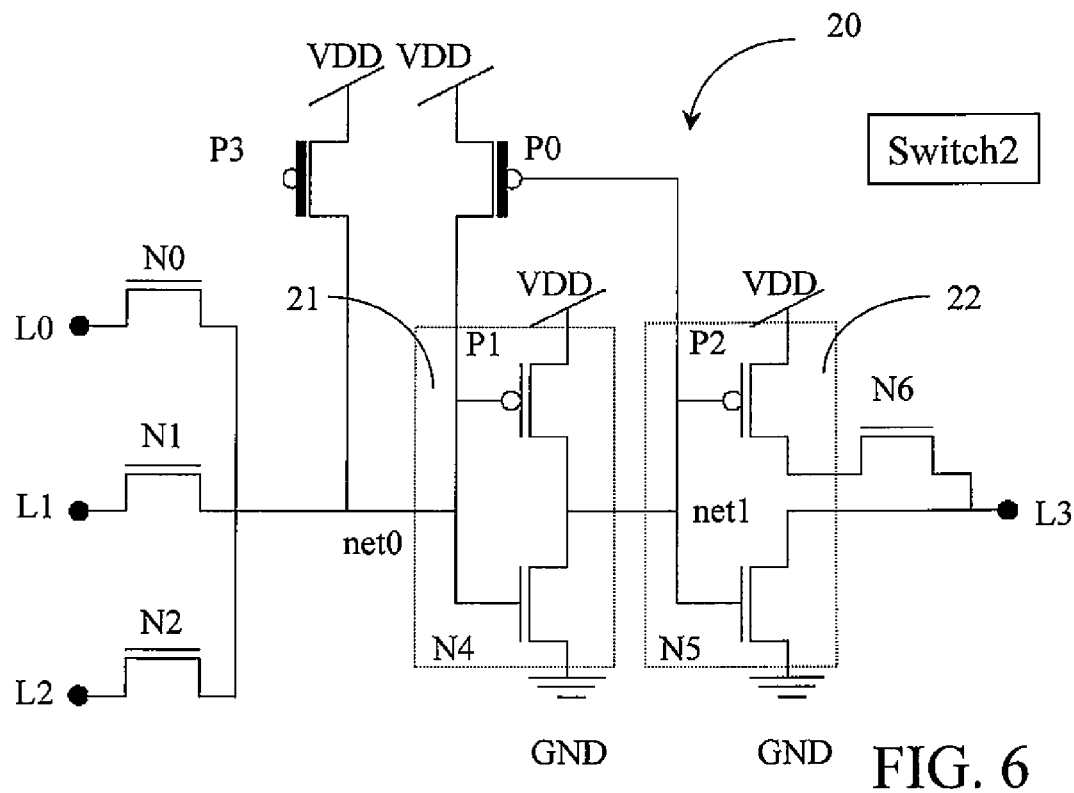
FIG. 6 schematically shows a switch block for FPGA architectures realized according to a second embodiment of the present invention.

This second embodiment is shown in FIG. 6, globally indicated as 20 or Switch2. It will be clear from the following description that the switch block 20 (Switch2) scheme has been designed in order to reduce the propagation delay of the switch block 20 (Switch0) scheme.

The switch block 20 (Switch2) shows a similar structure with respect to the known switch block (Switch0), the detailed description thereof being so omitted for sake of simplicity, only the differences being highlighted.

In particular, the NMOS transistor N5 of the second inverter 22 is directly connected to the fourth line L3, such that the pull down path of the buffer final stage according to such Switch2 scheme comprises only the transistor N5 itself.

Moreover, the pull down transistor N3 is substituted by a further pull-up transistor P3 inserted between the voltage supply reference VDD and the first internal node net0, the further pull-up transistor P3 being a high-voltage PMOS transistor.

Figure 7:
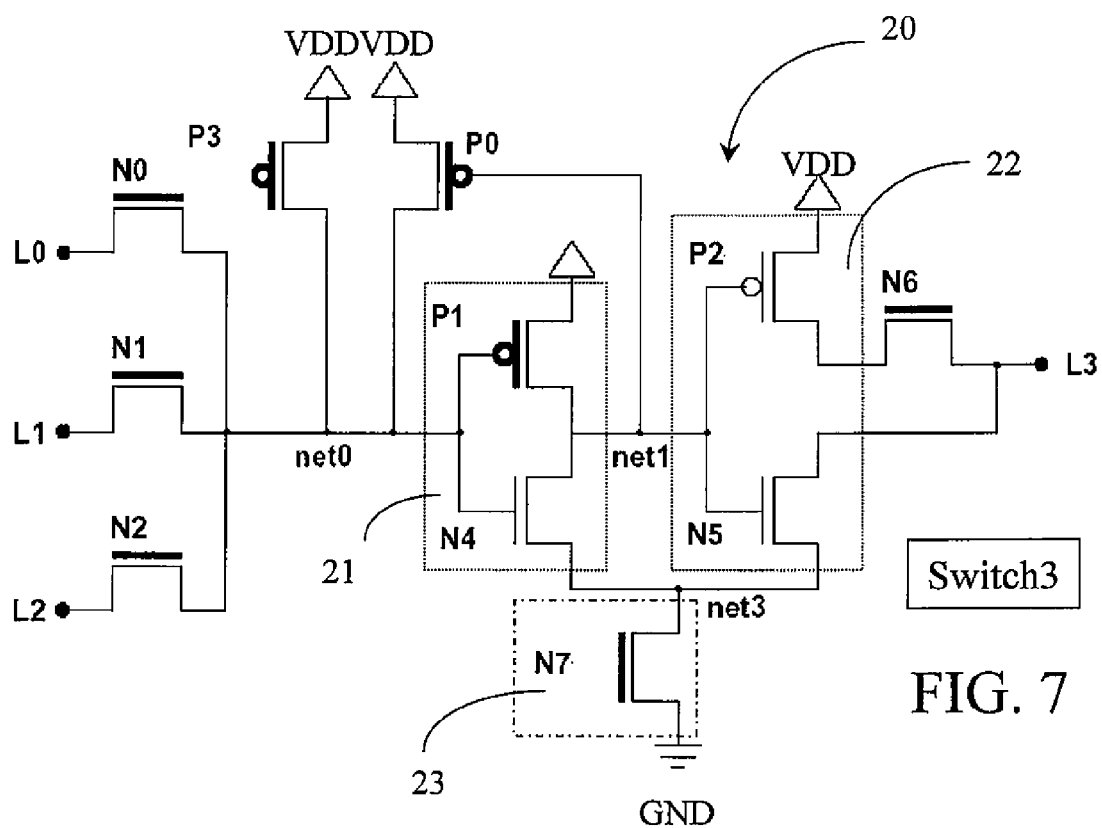
FIG. 7 schematically shows a switch block for FPGA architectures realized according to a third embodiment of the present invention.

According to a third embodiment of the invention, the switch block 20 also comprises a pull-down block 23 as described for the Switch1 scheme. This third embodiment has been indicated as Switch3 and schematically shown in FIG. 7.

In this case, the PMOS transistor P1 of the first inverter 21 has to be changed from a low-voltage to a high-voltage transistor, in order to avoid a large leakage power consumption through a path composed only of low-threshold transistors, in particular N5, N4 and P1.

Also in this case, the pull down transistor N3 is substituted by a further pull-up transistor P3 inserted between the voltage supply reference VDD and the first internal node net0, the further pull-up transistor P3 being a high-voltage PMOS transistor. In this way, the PMOS transistor P1 of the first inverter 21 is correctly turned off during the idle state of the switch block 20 (Switch3).

The increase of the variable contribution of leakage current through the input pass-transistors N0-N2 with respect to the condition of net0 pulled down is negligible because N0, N1 and N2 are small sized low-voltage transistors.

Also, it should be emphasized that the choice to have the PMOS transistor P1 instead of the NMOS transistor N4 of the first inverter 21 as a high-voltage transistor optimizes signal propagation delay, balancing rising and falling signal edges.

Comparing the first and third embodiments (Switch1 and Switch3) of the switch block 20 of the invention, it can be noticed that the main leakage current passes through the footer transistor N7. However the value of this current is quite different in the two embodiments because of the different voltages at the terminals of such footer transistor N7.

In particular, according to the first embodiment Switch1, during the idle state, the fourth internal node net3 asymptotically reaches the voltage supply value VDD, while according to the third embodiment Switch3 the same internal node net3 only reaches an lower value equal to VDD–Vth, thus obtaining a further reduced leakage current.

The switch blocks according to the Switch0(all Vth trans), Switch1 and Switch3 schemes have a consumption which is two orders of magnitude lower than the switch blocks according to the Switch0 and Switch0(Vth pass-trans) schemes, showing that the introduction of high-voltage transistors in the buffer stage of the switch block achieves a significant reduction of the leakage.

In particular the switch block Switch3 shows the lowest consumption, even lower than the known switch block Switch0 comprising only high threshold transistors. This is mainly due to the reduced voltage on the footer transistor N7.

Advantageously with the third embodiment of the invention, the switch block contribution to the leakage consumption of a FPGA architecture tile becomes negligible with respect to the other blocks. The same circuital scheme can also be applied for the output connect blocks, which cause most of the connect blocks dissipation.

The penalty to be paid for a low-leakage design is about 25% on the interconnect delay under same driving width conditions. Wider transistors could however be used in order to reduce this gap, all the more that the leakage advantage would remain substantially unchanged.

The switch block 20 (Switch3) also achieves the best performance, since it reduces the active leakage while keeping steep signal edges.

From an area occupation point of view, the introduction of the additional pull-down block 23, and in particular of the footer transistor N7 in the switch blocks according to the Switch1 and Switch3 schemes, increases the switch area of 37%, if considering also configuration memories. However since buffered switches are usually mixed with pass-transistors switches, the area increase of a FPGA architecture tile—where the switch block occupies 65% of the total area—is about 17%.

Figure 8:
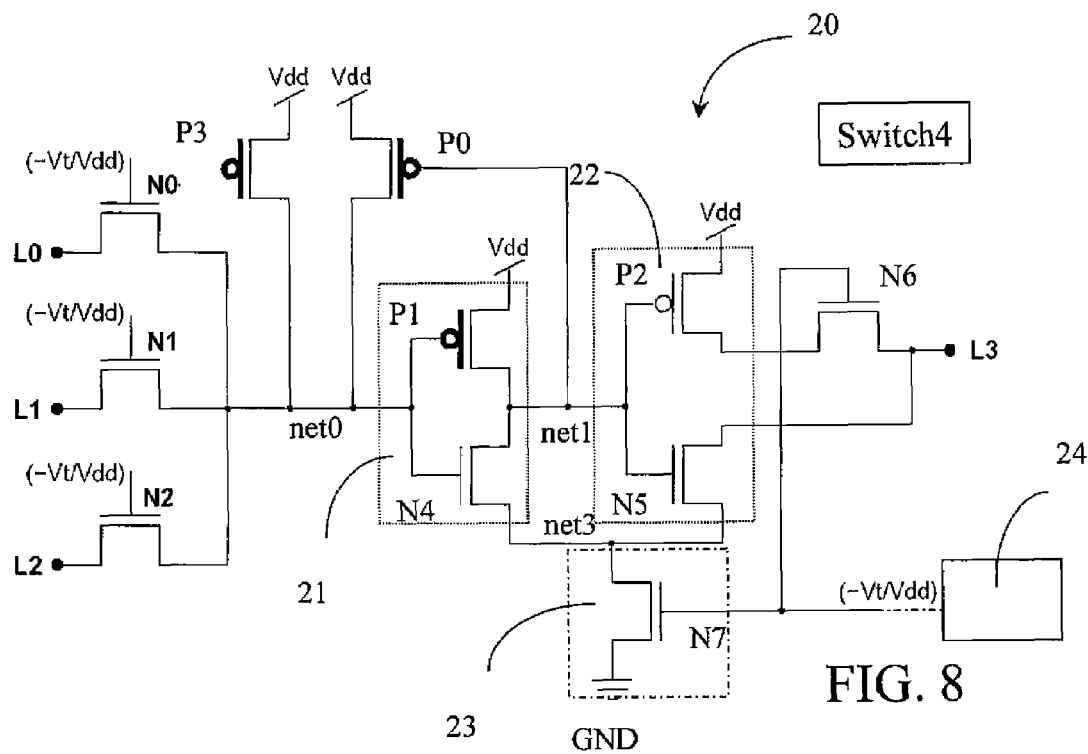
FIG. 8 schematically shows a switch block for FPGA architectures realized according to a fourth embodiment of the present invention.

A fourth embodiment of the switch block 20 according to the present invention is schematically shown in FIG. 8 and globally indicated as Switch4.

The switch block 20 according to the Switch4 scheme combines super cut-off, body biasing and multi-threshold techniques to reduce the leakage current of programmable interconnections, which give by far the main contribution to static power dissipation.

In particular, the switch block 20 (Switch4) has the same structure of the switch block 20 (Switch3) and additionally comprises a driving block 24 which is suitably connected to the gate terminals of the pass-transistors N0-N3 and N6 as well as of the footer transistor N7.

In particular, the driving block 24 applies to such gate terminals a negative voltage value between a negative voltage value −Vt and the supply voltage value VDD.

Since sub-threshold current of NMOS transistors exponentially depends on the gate-source voltage VGS, applying a reverse gate bias reduces about two orders of magnitude leakage consumption.

In particular, it should be noted that leakage current associated to the fourth embodiment of the invention, the switch block 20 (Switch4) shown in FIG. 8, is composed of a fixed contribution due to the intrinsic subthreshold current of the inverters 2 and 22, and of a variable contribution. The last one is due to the leakage current passing through the pass-transistors N0-N2 and N6, and depends on the difference of voltage levels between source and drain terminals of such pass-transistors.

The main advantage of this approach applied to pass transistors is that their leakage current can be reduced by three orders of magnitude with no penalty in area or delay with respect to the reference circuit using high-speed pass transistors. Notice that when all lines have logic "1", corresponding to the value VDD−Vtl, the drain-source voltage VDS of all pass-transistors (in the off state) is only Vtl, and the diode reverse current dominates the drain-source current IDS. For this reason in this case both implementations show the same power consumption.

It should be also noted that, in order to reduce the buffer intrinsic leakage power, a reverse gate bias cannot be applied to the NMOS transistor N5 of the second inverter 22, since its PMOS transistor P2 would have a body-gate voltage VBG higher than the recommended value equal to the supply voltage value VDD. This could break down the transistor gate oxide causing severe reliability problems.

For this reason a gate biased footer transistor N7 is added. The footer transistor N7 is controlled by a same signal applied to the fourth pass-transistor N6. Delay will increase due to the transistor series introduced, but much less than in the case of a fully dual-Vth approach, if the same area is kept.

Even in this super cut-off embodiment, some transistors have low threshold, and in particular the PMOS transistor P1 of the first inverter 21 is used to avoid leakage consumption through its NMOS transistor N4 and the NMOS transistor N5 of the second inverter 22, which leakage arises because of the direct connection to the fourth line L3.

Figure 9:
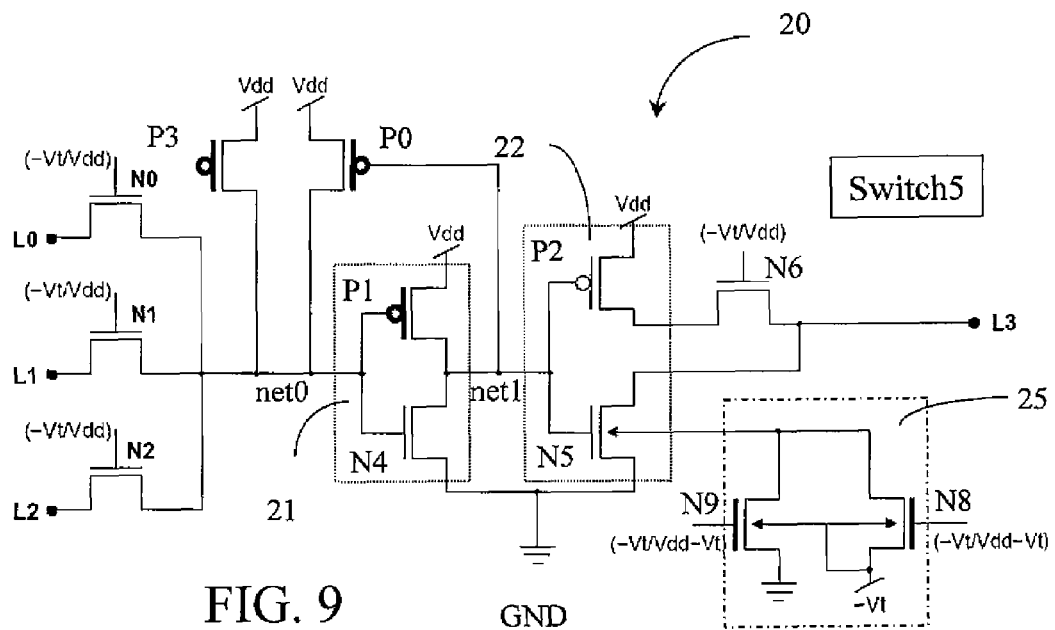
FIG. 9 schematically shows a switch block for FPGA architectures realized according to a fifth embodiment of the present invention.

Furthermore, according to a fifth embodiment of the invention, a body biasing is used instead to reduce the buffer intrinsic leakage in order to achieve a better power-delay tradeoff. The corresponding switch block 20 is shown in FIG. 9, also indicated as Switch5.

In particular, the switch block 20 according to the Switch5 scheme has the same structure of the switch block 20 according to the Switch2 scheme and further comprises a body biasing block 25 connected to the body terminal of the NMOS transistor N5 of the second inverter 22 in order to exploit the dependence of threshold voltage on the body-source voltage VBS modeled by the body effect.

In particular, the body biasing block 25 comprises a first N8 and a second biasing transistor N9, having their gate terminals connected to the driving block (not shown in the figure for sake of simplicity). The driving block is also connected to the gate terminals of the pass-transistors N0-N2 and N6.

The first biasing transistor N8 is connected between a body terminal of the NMOS transistor N5 of the second inverter 22 and a negative voltage reference −Vt and has its body terminal connected to the negative voltage reference −Vt and to the body terminal of the second bias transistor N9, being in turn connected between a body terminal of the NMOS transistor N5 of the second inverter 22 and ground GND.

In this way, the body biasing block 25 apply a negative voltage value −Vtl to a body or bulk terminal of an NMOS transistor in the off state and reduces the subthreshold current by one order of magnitude. This technique is better suited than gate biasing to the inverters 21 and 22, since it can be adopted in a single transistor, without affecting the others.

It should be noted that an isolated well is provided for each MOS transistor having a different bulk voltage. Since layout rules for triple well implementation impose an area overhead, body-biasing cannot be applied to each single pass-transistor, because of the large area occupation. However a biased pwell can be used only for the wide NMOS of the second or final inverter 22, which is the most power consuming and timing critical at the same time, once gate biasing is applied to pass-transistors, as shown in FIG. 9 for the Switch5 scheme. With such mixed approach, that can be indicated as a MTSCBB (Multi-Threshold-Super Cut-off-Body Biasing) approach, no footer transistor has to be inserted.

The switch block 20 (Switch5) thus comprises only minimum sized Vth bias transistors N8 and N9 which are alternatively turned on. In particular, when the switch block 20 (Switch5) is on, the second bias transistor N9 is active and the second or final inverter 22 behaves exactly as in the high-speed scheme (Switch2).

Otherwise, the first bias transistor N8 is turned on, biasing the bulk terminal of the NMOS transistor N5 of the second or final inverter 22 to a negative voltage, thus reducing leakage.

Since both the first and second bias transistors, N8 and N9, have a value −Vtl applied to their source terminals, their bulk terminals also need to be connected to the same voltage. As a consequence the voltage applied to their gate terminals should range between −Vtl and VDD−Vtl, in order to avoid a gate-bulk voltage VGB higher than the power supply voltage value VDD which could result in reliability problems on the gate oxide.

With respect to the high-speed implementation (Switch2), the PMOS transistor P1 of the first inverter 21 is turned to a high threshold one in order to avoid a high leakage current through the first inverter 21 itself. This adds some delay to the critical path, however it is not so critical since the first inverter 21 only drives a local line.

It should be noted that the exploitation of super cut-off and body biasing techniques requires that the switch blocks 20 realized according the proposed Switch4 and Switch5 schemes are supplied with control signals having a swing out of standard 0-VDD.

In particular, according to the invention, the driving block 24 should be a high swing signal circuit. However switch control signal are generated by SRAM cells which are rarely configured, giving a negligible contribution to dynamic power dissipation. On the other hand, static configuration memories are not on the critical path, thus they can be implemented with high-voltage transistors which cut down leakage current.

Moreover, voltages higher than the power supply voltage VDD have been extensively used for pass-transistor gate boosting. However, as technology scales, gate oxide thickness is so small that reliability has become an issue when a voltage out of the standard range need to applied.

Furthermore in the case of the combined low-leakage technique proposed, different signals controlling the switch block require different swings.

Figure 10:
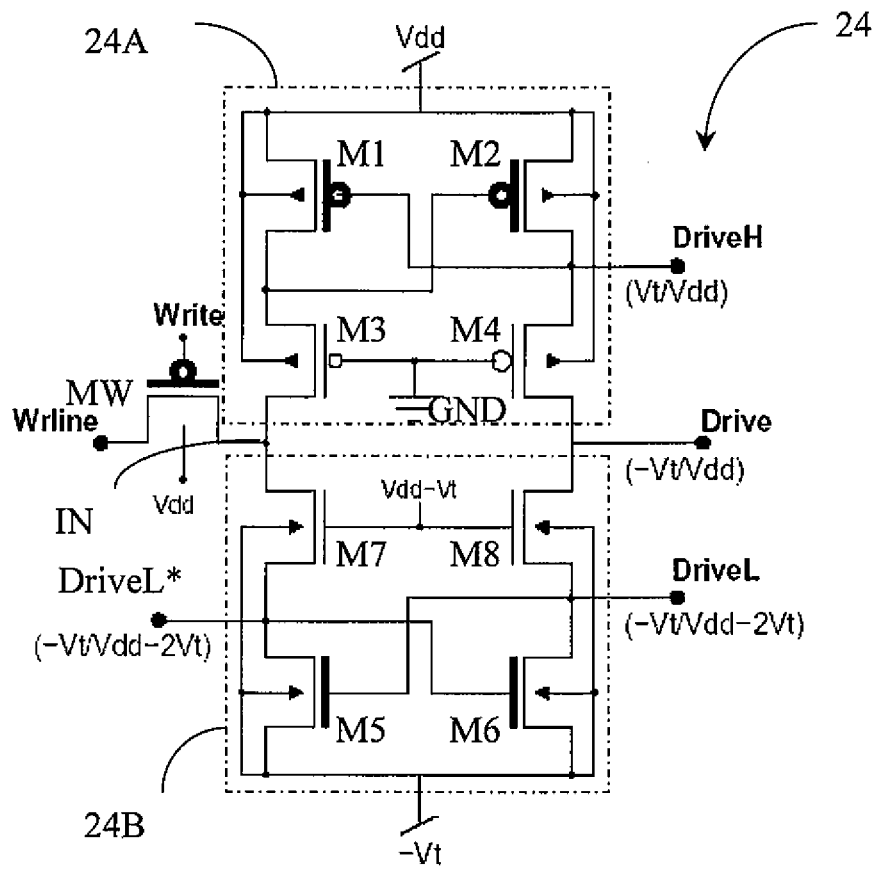
FIG. 10 schematically shows a high swing SRAM cell to be used with the switch block of FIG. 9.

In order to comply to the above requirement, the driving block 24 is realized by using a suitable design of a small SRAM cell, which is also free of reliability problems, as shown in FIG. 10 also indicated as 24.

The SRAM cell 24 is connected between a first and a second voltage references, in particular, the supply voltage reference VDD and the negative voltage reference −Vt.

In particular, the SRAM cell 24 comprises:

a first or high block 24A inserted between the supply voltage reference VDD and a first output terminal Drive; and a second or low block 24B, in turn inserted between the first output terminal Drive and the negative voltage reference −Vt.

The high and low blocks 24A and 24B are also connected to each other and to an input terminal IN, which is in turn connected to a write transistor MW.

The high block 24A comprises a first M1 and a second high-voltage PMOS transistors M2 as well as a first M3 and a second low-voltage NMOS transistors M4. In particular, the first PMOS transistor M1 and the first NMOS transistor M3 are inserted, in series to each other, between the supply voltage reference VDD and the input terminal IN and have their body or bulk terminals connected to the supply voltage reference VDD. The first PMOS transistor M1 has a gate terminal connected to a second output terminal DriveH.

In a similar manner, the second PMOS transistor M2 and the second NMOS transistor M4 are inserted, in series to each other, between the supply voltage reference VDD and the first output terminal Drive and have their body or bulk terminals connected to the supply voltage reference VDD. The second PMOS transistor M2 has a gate terminal connected to a common drain terminals of the first PMOS transistor M1 and of the first NMOS transistor M3.

The first M3 and second NMOS transistors M4 have their gate terminals connected to each other and to the ground GND.

The low block 24A comprises a third M5 and a fourth high-voltage NMOS transistors M6 as well as a fifth M7 and a sixth low-voltage NMOS transistors M8. In particular, the third and fifth NMOS transistors, M5 and M7, are inserted, in series to each other, between the input terminal IN and the negative voltage reference −Vt and have their body or bulk terminals connected to the negative voltage reference −Vt. The third NMOS transistor M5 has a gate terminal connected to a third output terminal DriveL.

In a similar manner, the fourth and sixth NMOS transistors, M6 and M8, are inserted, in series to each other, between the first output terminal Drive and the negative voltage reference −Vt and have their body or bulk terminals connected to the negative voltage reference −Vt. The fourth NMOS transistor M6 has a gate terminal connected to a fourth output terminal DriveL*.

The fifth and sixth NMOS transistors, M7 and M8, have their gate terminals connected to each other and receiving a voltage value equal to VDD−Vt.

It should be noted that a standard four transistor bistable circuit cannot be used in this case where output terminal assumes −Vt as low logic level. In fact, if this negative voltage signal is directly connected to a gate terminal of a PMOS transistor, as in standard bistable circuit, the body-gate voltage VBG would be higher than the power supply voltage VDD, causing the break down of its gate oxide. The same considerations apply to NMOS transistors having the bulk terminal connected to −Vt.

For this reason, the SRAM cell 24 comprises four low-threshold MOS transistors, namely M3, M4, M7 and M8 resulting in a stack of transistors which generates the same logic value with three different swing values. In this way, only low-swing signals are connected to the gate terminals of the transistors.

It should be noted that the signals provided by the SRAM cell 24 are suitable to drive all programmable transistors in the switch block 20 according to the Switch4 and also to the Switch5 scheme.

In particular, for a switch block 20 according to the Switch5 scheme, the first output terminal Drive drives the pass-transistor N6 connected to the fourth line L3, the third output terminal DriveL is connected to the first N8 and second bias transistor N9 and the second output terminal DriveH controls the second pull-up transistor P3.

It should be remarked that the bias transistors N8 and N9 are only partially on with a voltage value equal to VDD−2Vt applied to their gate terminals. However since they are pull-down transistors, this is not a problem. The same consideration apply for the pull-up transistor P3.

Figure 11:
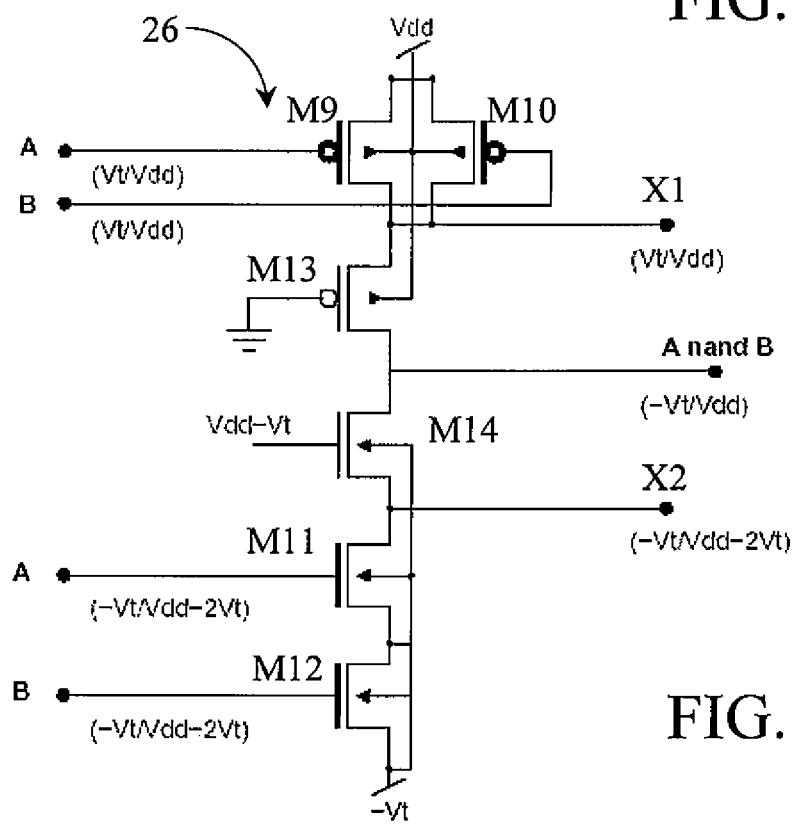
FIG. 11 schematically shows a high swing logic to be used with the switch block of FIG. 9.

Since some decoding logic is often used between SRAM cells and programmable transistors, high swing logic capable of generating all the different swing signals is needed, as shown in FIG. 11, globally indicated at 26.

The swing logic 26 implements a NAND gate and is connected between the supply voltage reference VDD and the negative voltage reference −Vt.

In particular, the swing logic 26 comprises a first M9 and a second high-voltage PMOS swing transistors M10 inserted, in parallel to each other, between the supply voltage reference VDD and a first node X1. The first PMOS swing transistor M9 has a gate terminal connected to a first line A and the second PMOS swing transistor M10 has gate terminal connected to a second line B.

The swing logic 26 also comprises a first M11 and a second high-voltage NMOS swing transistors M12, inserted, in series to each other, between a second node X2 and the negative voltage reference −Vt. The first NMOS swing transistor M11 has a gate terminal connected to the first line A and the second NMOS swing transistor M12 has gate terminal connected to the second line B.

Finally, the swing logic 26 comprises a first and a second low-voltage NMOS swing transistors, M13 and M14, inserted, in series to each other, between the first and second nodes, X1 and X2. The first low-voltage NMOS swing transistor M13 has a gate terminal connected to ground GND, while the second low-voltage NMOS swing transistor M13 has a gate terminal receiving a voltage value equal to VDD−Vt.

The first and second PMOS swing transistors, M9 and M10, as well as the first low-voltage NMOS swing transistor M13 have their bulk terminals connected to the supply voltage reference VDD.

Furthermore, the first and second NMOS swing transistors, M11 and M12, as well as the second low-voltage NMOS swing transistor M14 have their bulk terminals connected to the negative voltage reference −Vt.

In summary, similarly to the SRAM cell 24, two low-voltage transistors, namely M13 and M14, in series to each other, are introduced to avoid large gate-bulk voltages. The lines A and B carrying the same signal with different swings need to be fed for each gate terminal. Both signals are directly generated by a preceding high swing stage that could be either the SRAM cell 24 shown in FIG. 10 or another logic gate.

Both the proposed SRAM cell 24 and swing logic 26 are not critical for delays, therefore they are implemented with a mixture of high and low threshold transistors, such that leakage consumption is minimal.

Concerning leakage the proposed techniques—Dual-Vt (Switch3), Super cut-off (Switch4) and MTSCBB (Switch5)—are all effective in reducing it by at least one order of magnitude. Super cut-off (Switch3) achieves the best performance such that the SRAM cells give the main contribution to power. This result suggests that it is not useful to further reduce the switch buffer leakage consumption.

The combined MTSCBB technique (Switch5) on the other hand achieves 6× the dissipation of the super cut-off one (Switch4). This is due to the fact that transistor threshold depends on the square root of bulk voltage through the body effect parameter. Since leakage current is an exponential function of both VGS and Vt, in order to achieve the same reduction a stronger bias needs to be applied to bulk than to gate.

Furthermore the super cut-off buffer leakage is particularly small also because of the transistor stack effect caused by the introduction of the footer transistor N7, which reduces its drain-source voltage VDS. Anyway, since bias voltage depends on the negative supply voltage chosen, this can be tuned in order to achieve even lower leakage consumption in both super cut-off (Switch4) and MTSCBB techniques (Switch5).

From an area occupation point of view, both the Dual-Vt (Switch3) and the super cut-off techniques (Switch4 and Switch5) require additional area for the wide footer transistor. On the other hand MTSCBB and gate biasing have an overhead due to the use of eight-transistor SRAM cells which also have bulk terminals of their NMOS transistors connected to a negative voltage. In this case, layout rules require for example to have a minimum distance separating differently biased wells.

As a consequence the super cut-off scheme (Switch4) has the largest switch buffer area, while MTSCBB scheme (Switch5) is penalized the least, with only 15% increase.

As expected delay increases when adopting low-leakage design techniques. While the dual-Vt scheme (Switch3) has 36% penalty with respect to a high speed implementation, MTSCBB scheme (Switch5) has only 5% increase.

As expected leakage consumption greatly increases with respect to 130 nm, demonstrating the need for sharp solutions to tackle the rapidly growing problem of static power dissipation. Table V also shows that the proposed approach maintains the same effectiveness in reducing leakage power also in 90 nm technology.

Figure 14:
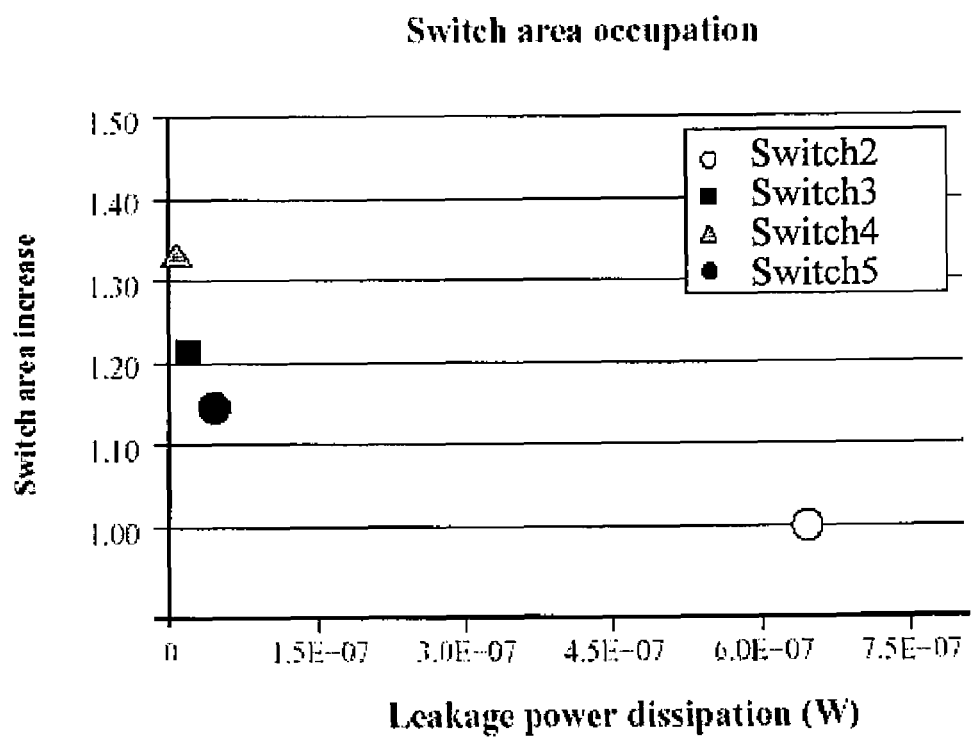
FIG. 14 schematically shows experimental results comparing the switch blocks of FIGS. 6, 7, 8 and 9.

To better show the tradeoffs of the proposed schemes, FIG. 14 depicts area vs leakage graph where it clearly appears that the MTSCBB scheme (Switch5) outperforms the other schemes.

A few considerations on the impact of the proposed approaches over an entire tile can be made. Cutting down the switch block leakage consumption, its contribution to the tile becomes much smaller than the other blocks. Since exactly the same technique can also be applied for connect blocks, a 4× leakage power reduction can be achieved for the entire tile.

The impact of the area overhead penalty also needs to be evaluated over an entire tile in the case the MTSCBB scheme (Switch5) is adopted for all programmable interconnections comprising connect blocks. If we assume that routing resources occupy 60% of the area, the penalty is only 9%.

On the timing performance point of view, since the critical path of a mapped circuit also comprises logic block delays, assuming that 65% of the total delay is due to programmable interconnections, the overall delay penalty becomes only 3%.

Figure 12:
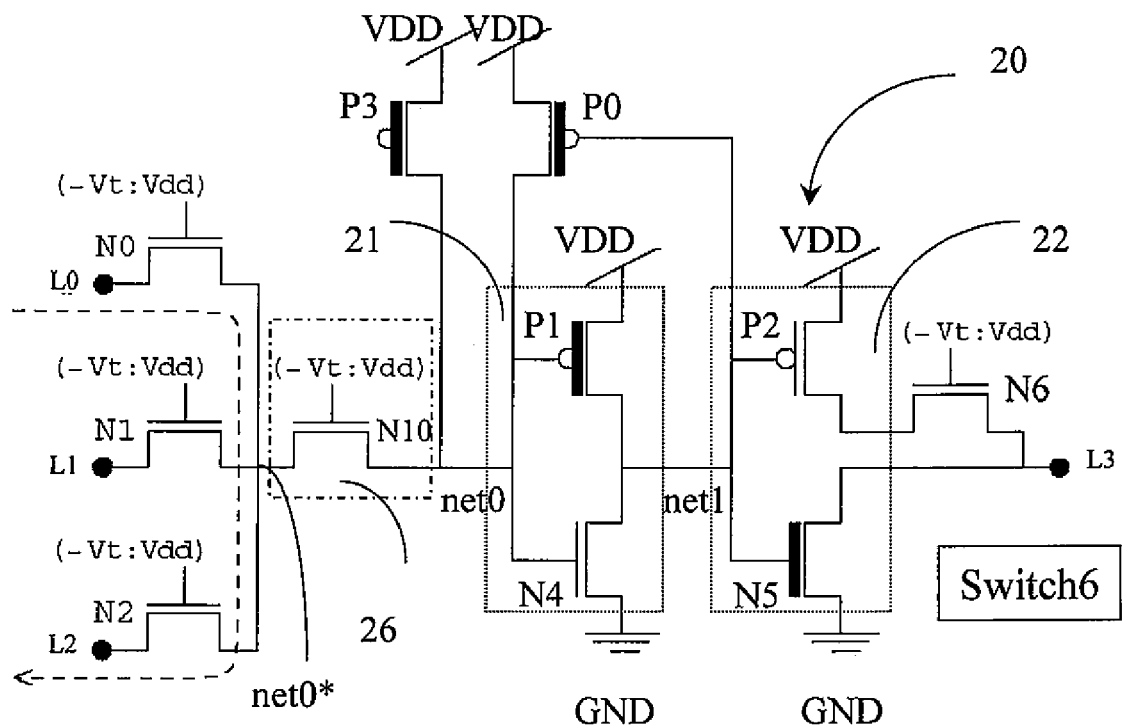
FIG. 12 schematically shows a switch block for FPGA architectures realized according to a sixth embodiment of the present invention.

A sixth embodiment of the switch block according to the invention is shown in FIG. 12 and globally indicated at 20 or Switch6. This embodiment copes with the tradeoff between signal propagation delay and leakage power dissipation.

As will be clear from the following description, the switch block 20 (Switch6) has been redesigned through hardware solutions aimed at the reduction of leakage power and the development of an external software programmability leading to a run-time minimization of subthreshold current.

In particular, the switch block 20 (Switch6) has a same structure as a switch block according to the Switch2 scheme above described.

With respect to the Switch2 scheme, the PMOS transistor P1 of the first inverter 21 and the NMOS transistor N5 of the second inverter 22 have been turned from low or standard voltage transistors to high-voltage ones, the NMOS transistor N5 keeping the same size.

This modification achieves the advantage of reducing leakage injection on internal nodes net0 and net1 as well as balancing the rising and falling output edge. In fact the presence of the fourth pass-transistor N6 connected to the fourth line L3, which is the tristate buffer output terminal, reduces the signal swing by one threshold voltage, affecting the rising transition delay of following switches.

Since the rising transition is the critical one, only transistors involved in the output falling transition have been turned into high-voltage transistors, thus with the effect of balancing the two edges as well.

Furthermore, when the switch block 20 is in stand-by, the fourth pass-transistor N6 is off while the second pull-up transistor P3 is on, such that the PMOS transistor P2 of the first inverter 21 and the NMOS transistor N5 of the second inverter 22 are switched off to guarantee the high-impedance on the output terminal L3.

In this condition every current path passes through a high voltage transistor in the off state, achieving a considerable reduction in stand-by leakage consumption. However the improvement is not limited to the stand-by mode, since the same condition holds when propagating a high logic value through the switch block 20 (Switch6). As a consequence active leakage results cut down half the times, resulting in an average reduction of almost 50%.

Moreover, an additional input transistor N10 has been inserted between an input internal node net0* and the first internal node net0. In this way, the input pass-transistors N0-N1 are connected to the input internal node net0* and the switch block 20 (Switch6) has an input mux comprising the input pass-transistors N0-N1 and the additional input transistor N10.

When this additional input transistor N10 is off, it isolates the pass-transistors N0-N2 from the following buffering stage of the switch block so that an unbuffered connection can be implemented simply by turning a couple of input pas-transistors on. When the additional input transistor N10 is on, the penalty to the buffer propagation delay is negligible.

The driving signals of each pass-transistor have a range value included in [−Vt:VDD] according to the super cutoff technique (Switch4), the gate terminals of the input pass-transistors N0-N1 and of the additional input transistor N10 being connected to a driving block (not shown in the figure for sake of simplicity). The driving block provides the needed voltage value in the range (−Vt:VDD). Since there is an exponential dependence of sub-threshold current on the gate-source voltage VGS, this technique achieves more than order of magnitude leakage reduction. The extended voltage swing of values of the driving signals for each pass-transistor does not induce any further delay since it regards only the case when the pass-transistor is off.

The introduction of the additional input transistor N10 allows the adoption of a driving techniques in order to reduce active leakage consumption, as will be explained in the following description.

When the additional input transistor N10 is on, the buffering stage is used to propagate a signal from an input line L0-L2 to the output line L4.

However, also in the case the additional input transistor N10 is off, the switch block 20 can be exploited to propagate a signal between two lines by turning on the desired pass-transistors composing the input mux.

Figure 13:
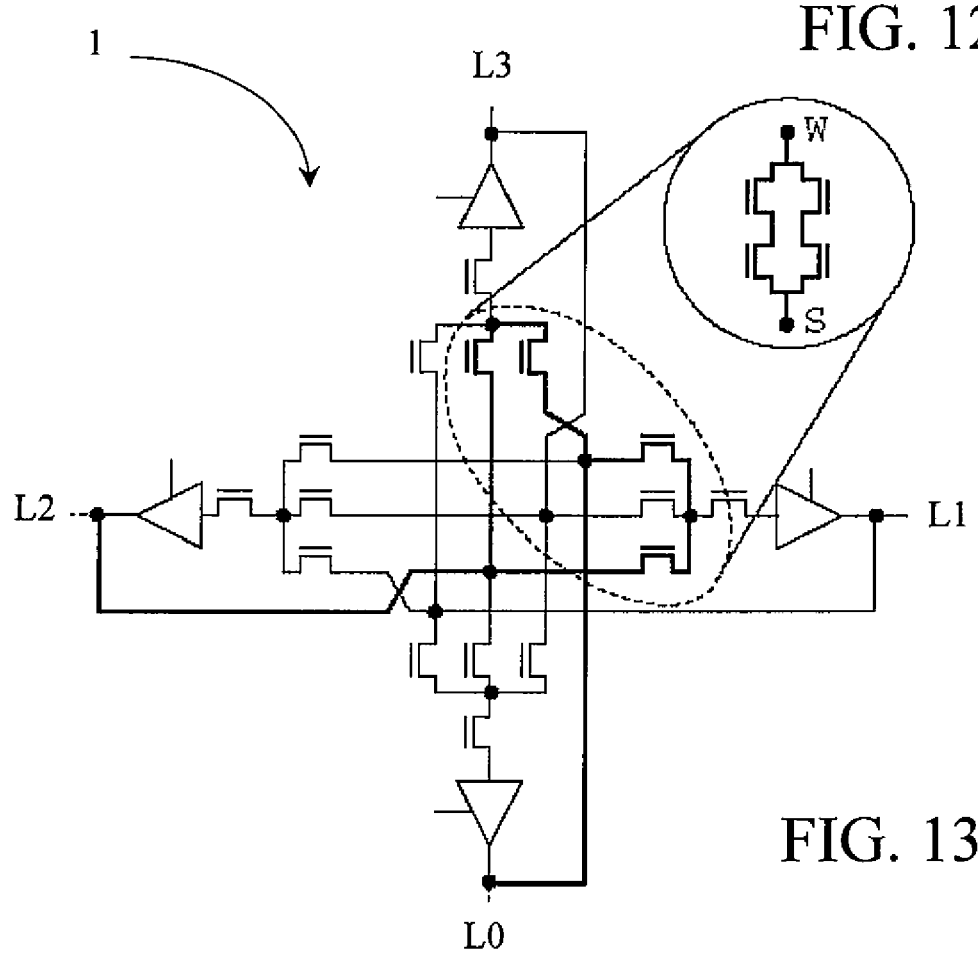
FIG. 13 schematically shows an unbuffered configuration of the switch block of FIG. 12.

An unbuffered path (connecting the first line L0 to the third line L2) is shown in FIG. 12 with a dashed line which passes through a series of two NMOS transistors. When considering a full switch connecting four wires, two of the four buffers can be exploited together to connect the same wires. In FIG. 13, a double path connecting L0 and L2 lines is highlighted, and the resulting circuit is depicted.

In should be emphasized that the four NMOS pass-transistors considered are the parallel of a series of two transistors, with an equivalent channel width equal to the channel width of a single NMOS pass transistor.

When the switch block 20 (Switch6) is configured to operate in unbuffered mode, the corresponding buffer can be completely switched off by turning off the output pass-transistor N5 and the additional input transistor N10 and turning on the second pull-up transistor P0. As a result, the buffering part of the switch block 20 (Switch6) has the same leakage current obtained in standby condition, even though the switch block is effectively used. In this case the active leakage can be reduced by one order of magnitude.

The possibility of exploiting the switch block 20 (Switch6) in the unbuffered operating mode is strictly related to the performance degradation deriving from the propagation of signals through a pass series instead of buffers. In order to evaluate such a delay increase, an analysis has been carried out on a set of MCNC benchmark using VPR as described by Bets et al. in "Architecture and CAD for Deep-Submicron FPGAs", Kluwer Academic Publishers, 1999.

A routing architecture with only unbuffered switches (modeled by cMOS pass-transistors) achieves the minimum active leakage power, since the buffering stage is completely avoided. However in this configuration the average critical path increases of about 20% on 80% of the studied benchmark and of 64% on the largest algorithms.

Since the routing architecture according to the switch6 scheme is based on nMOS pass transistors instead of cMOS ones, the degradation of a signal crossing a series of more than four switches makes this solution unacceptable both in terms of signal delay and of dynamic power dissipation.

Therefore, when using a switch block according to the Switch6 scheme, the substitution of buffered switches with unbuffered ones is made only in the case the critical path is not increased.

In this regard, it should be noted that, in order to avoid excessive signal degradation, only series of at most two pass transistors are allowed.

Advantageously according to this sixth embodiment of the invention, a configuration method has been also developed to substitute the buffered switches with unbuffered ones in a circuit mapped on a FPGA architecture. The method comprises the following steps:

1) Timing analysis of the graph of nodes representing routing and logic resources of the FPGA architecture used by the mapped circuit. The slack obtained for each net represents the delay which can be added without modifying the critical path.

2) Substitution of a buffered switch with an unbuffered one starting from the input nodes of the analyzed circuit.

3) Verification that the critical path delay has not been modified through timing analysis.

4) If the substitution is done, all slacks are recalculated, returning to step 2.

The substitution of a buffered switch with an unbuffered one increases the delay of the related path. However, if the net is multi-fanout, its load capacitance also increases, introducing an additional delay. Therefore step 3 is necessary to correctly take in consideration this case.

As result, the proposed configuration method could substitute about 39% of buffered switches with unbuffered ones, obtaining a corresponding reduction of active leakage power dissipation without performance degradation.

The combination of the hardware techniques described (dual-threshold and super cut-off techniques) allows to reduce the standby leakage power more than one order of magnitude.

It should be noted that the induced super cut-off condition reduces the subthreshold current associated to each NMOS transistor of about two order of magnitude compared with a typical turn off state.

Active power dissipation is reduced from 15% to more than one order of magnitude, depending on the switch configuration and signal logic values at the boundary.

Figure 4:
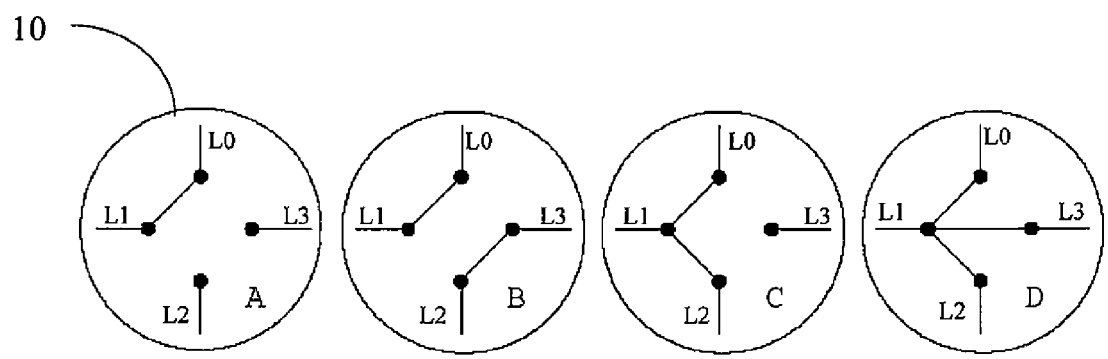
FIG. 4 schematically shows connections realized by a switch block in a switch matrix of a FPGA architecture.
Figure 15:
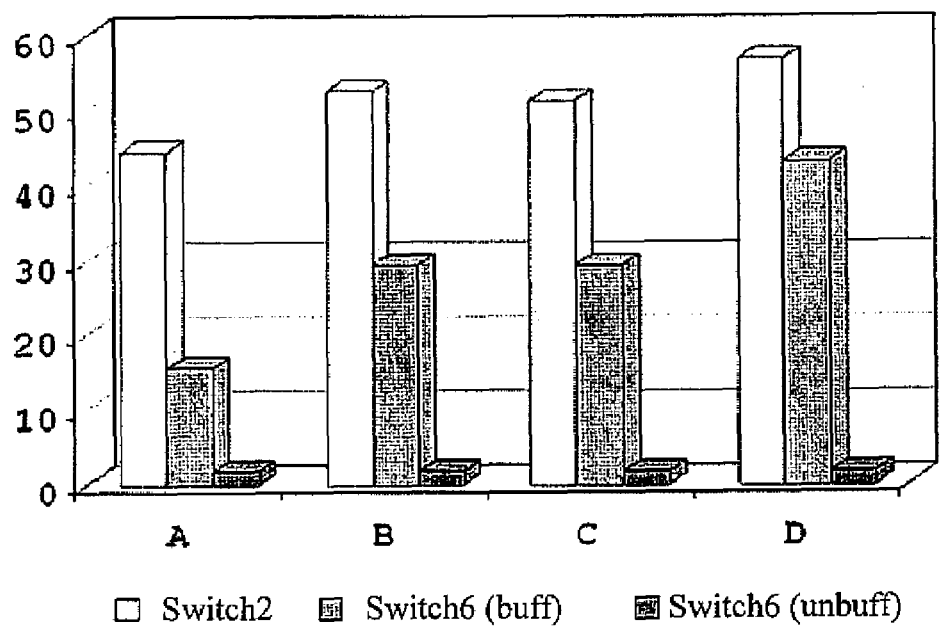
FIG. 15 schematically shows experimental results comparing the switch blocks of FIGS. 6 and 12.

FIG. 15 shows the average active leakage power dissipation comparing switch blocks according to the Switch2 and Switch6 schemes, the last in buffered and unbuffered mode. The analysis has been carried out for the four possible configurations of the switch block 20 as shown in FIG. 4 (A,B,C,D), and the average of active leakage power has been calculated considering each combination of signal values at the switch pins. The average result is a global reduction of around 44%.

Finally, when also applying the software approach proposed, the active subthreshold current of each switch buffer is reduced of almost two order of magnitude: this result can be observed in the third columns of the histogram of FIG. 16.

However, as explained before, the change from a buffered switch to an unbuffered switch without performance degradation is possible only for almost 39% of the total switch buffers. As a result, we obtain a global reduction of active leakage current of about 82%.

The signal propagation between two consecutive switch block according to the Switch2 scheme has a small performance degradation (less than 8%) with respect to the Switch6 scheme. This is due to the utilization of high-voltage transistors (namely P1 and N5) instead of standard or low-voltage ones on the signal falling path.

The area occupation of the different switch implementations has been compared in terms of number of minimum sized transistors. The area occupied by the switch block according to the Switch6 scheme increases by 36% with respect to the one according to the Switch2 scheme. This difference is due to:

the size of each input pass-transistor, which is double compared to the corresponding MOS of the switch block according to the Switch2 scheme (20%);

the different implementation of SRAM memory cell which is necessary to increase the voltage swing of the pass-transistors driving signals (15%);

the resizing of the PMOS transistor P1 of the first inverter 21, which is necessary in order to balance the signal rising and falling path (1%);

However, when hypothesizing that the percentage of the total area occupied by the switch block is about 60% and considering that it is composed of a mixture of buffers and pass transistors, the FPGA architecture total area increase results less than 17%.

In summary, the embodiments of a switch block for FPGA architectures according to the invention combine hardware and software techniques and thus reduce both active and standby leakage power.

In particular, exploiting a dual-VT scheme the switch block is modified mixing high and low threshold transistor in order to reduce the leakage current, as in the Switch1, Switch2 and Switch3 schemes. The proposed switch blocks provide the best trade-off between power consumption and propagation delay.

Furthermore, the combined approach of the Low-leakage and Super cut-off techniques, according to the Switch4 scheme, reduces leakage power consumption of programmable interconnects by at least one order of magnitude. Moreover the MTSCBB (Multi-Threshold-Super Cut-off-Body Biasing) technique used in the Switch5 scheme exploits the advantages of all previous technique obtaining a switch delay penalty of only 5% and an area penalty over an entire tile is only 9%.

Moreover, the Switch6 scheme allows to minimize both the standby leakage current and the active one using a combination of dual-VT and super cut-off techniques. In this way an optimized trade-off between global leakage power reduction and timing performance is obtained.

Finally, the use of the described configuration method, which is strictly related to the switch architecture, is useful to minimize active subthreshold current.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A switch block connecting a first, second, third and fourth lines and comprising:
a first pass-transistor connected between the first line and a first internal node;
a second pass-transistor connected between the second line and the first internal node;
a third pass-transistor connected between the third line and the first internal node;
a fourth pass-transistor connected between the fourth line and a second internal node;
a first inverter and a second inverter, inserted between the first and the second internal node and interconnected at a third internal node;
the first inverter comprising a PMOS transistor and an NMOS transistor connected in series to each other and between the first voltage reference and a fourth internal node, the transistors of the first inverter having their gate terminals connected to each other and to the first internal node and common drain terminals connected to the third internal node;
the second inverter comprising a PMOS transistor and an NMOS transistor connected in series to each other and between the first voltage reference and the fourth internal node, the transistors of the second inverter having their gate terminals connected to each other and to the third internal node and common drain terminals connected to the second internal node; and
wherein the fourth internal node is connected to a second voltage reference by means of a pull-down block.

2. The switch block of claim 1, further comprising:
a pull down transistor inserted between the first internal node and the second voltage reference; and
a pull up transistor inserted between the first voltage reference and the first internal node, the pull up transistor having its gate terminal connected to the third internal node;
wherein the pull down and pull up transistors are high-voltage transistors.

3. The switch block of claim 1 wherein the pull-down block comprises an additional pull-down transistor inserted between the fourth internal node and the second voltage reference.

4. The switch block of claim 3 wherein the additional pull down transistor is a high-voltage transistor.

5. The switch block of claim 1 wherein the pass-transistors are high-voltage transistors.

6. A switch block connecting a first, second, third and fourth lines and comprising:
a first pass-transistor connected between the first line and a first internal node;
a second pass-transistor connected between the second line and the first internal node;
a third pass-transistor connected between the third line and the first internal node;
a fourth pass-transistor connected to the fourth line;
first and a second inverters inserted between the first internal node and the fourth line and interconnected at a second internal node;
the first inverter comprising a PMOS transistor and an NMOS transistor connected in series to each other and between the first and second voltage references, the transistors of the first inverter having their gate terminals connected to each other and to the first internal node and common drain terminals connected to the second internal node;
the second inverter comprising a PMOS transistor and an NMOS transistor connected in series to each other and between the first and second voltage references, the transistors of the second inverter having their gate terminals connected to each other and to the second internal node wherein the NMOS transistor of the second inverter is directly connected to a first conduction terminal of the fourth pass-transistor and to the fourth line and the PMOS transistor of the second inverter is connected to a second conduction terminal of the fourth pass-transistor.

7. The switch block according to claim 6, further comprising:
a pull up transistor inserted between the first voltage reference and the first internal node; and
a further pull up transistor inserted between the first voltage reference and the first internal node
the pull up transistor having its gate terminal connected to the second internal node,
wherein the pull up transistors are high-voltage transistors.

8. A switch block connecting a first, second, third and fourth lines and comprising:
a first pass-transistor connected between the first line and a first internal node;
a second pass-transistor connected between the second line and the first internal node;
a third pass-transistor connected between the third line and the first internal node;
a fourth pass-transistor connected to the fourth line;
a first and a second inverters, inserted between the first internal node and the fourth line, interconnected at a second internal node;
the first inverter comprising a PMOS transistor and an NMOS transistor connected, in series to each other, between the first voltage reference and a third internal node, the transistors of the first inverter having their gate terminals connected to each other and to the first internal node and common drain terminals connected to the second internal node;
the second inverter comprising a PMOS transistor and an NMOS transistor connected, in series to each other, between the first voltage reference and the third internal node, the transistors of the second inverter having their gate terminals connected to each other and to the second internal node
wherein the NMOS transistor of the second inverter is directly connected to the fourth line and the PMOS transistor of the second inverter is connected to the fourth pass-transistor and
wherein the third internal node is connected to a second voltage reference by means of a pull-down block.

9. The switch block according to claim 8, further comprising:
a pull up transistor inserted between the first voltage reference and the first internal node; and
a further pull up transistor inserted between the first voltage reference and the first internal node
the pull up transistor having its gate terminal connected to the second internal node,
wherein the pull up transistors are high-voltage transistors.

10. The switch block according to claim 8 wherein the pull-down block comprises an additional pull-down transistor, inserted between the third internal node and the second voltage reference.

11. The switch block according to claim 10 wherein the additional pull down transistor is a high-voltage transistor.

12. The switch block according to claim 8 wherein the pass-transistors are high-voltage transistors.

13. The switch block according to claim 8 wherein the PMOS transistor of the first inverter is a high-voltage transistor.

14. A switch block connecting a first, second, third and fourth lines and comprising:
a first pass-transistor connected between the first line and a first internal node;
a second pass-transistor connected between the second line and the first internal node;
a third pass-transistor connected between the third line and the first internal node;
a fourth pass-transistor connected to the fourth line;
a first and a second inverters, inserted between the first internal node and the fourth line, interconnected at a second internal node;
the first inverter comprising a PMOS transistor and an NMOS transistor connected, in series to each other, between the first voltage reference and a third internal node, the transistors of the first inverter having their gate terminals connected to each other and to the first internal node and common drain terminals connected to the second internal node;
the second inverter comprising a PMOS transistor and an NMOS transistor connected, in series to each other, between the first voltage reference and the third internal node, the transistors of the second inverter having their gate terminals connected to each other and to the third internal node
wherein the NMOS transistor of the second inverter is directly connected to the fourth line and the PMOS transistor of the second inverter is connected to the fourth pass-transistor;
wherein the third internal node is connected to a second voltage reference by means of a pull-down block; and
wherein the switch block further comprises a driving block connected to the gate terminals of the pass-transistors as well as to the pull-down block.

15. The switch block according to claim 14 wherein the pull-down block comprises an additional pull-down transistor, inserted between the third internal node and the second voltage reference and having a gate terminal connected to the driving block.

16. The switch block according to claim 14 wherein the driving block provides a voltage value between a negative value and the value of the first voltage reference.

17. The switch block according to claim 14, further comprising:
a pull up transistor inserted between the first voltage reference and the first internal node; and
a further pull up transistor inserted between the first voltage reference and the first internal node
the pull up transistor having its gate terminal connected to the second internal node,
wherein the pull up transistors are high-voltage transistors.

18. The switch block according to claim 14 wherein the PMOS transistor of the first inverter is a high-voltage transistor.

19. A switch block connecting a first, second, third and fourth lines and comprising:
a first pass-transistor connected between the first line and a first internal node;
a second pass-transistor connected between the second line and the first internal node;
a third pass-transistor connected between the third line and the first internal node;
a fourth pass-transistor connected to the fourth line;
a first and a second inverters, inserted between the first internal node and the fourth line, interconnected at a second internal node;
the first inverter comprising a PMOS transistor and an NMOS transistor connected, in series to each other, between the first and second voltage references, the transistors of the first inverter having their gate terminals connected to each other and to the first internal node and common drain terminals connected to the second internal node;

the second inverter comprising a PMOS transistor and an NMOS transistor connected, in series to each other, between the first and second voltage references, the transistors of the second inverter having their gate terminals connected to each other and to the second internal node wherein the NMOS transistor of the second inverter is directly connected to the fourth line and the PMOS transistor of the second inverter is connected to the fourth pass-transistor;

wherein the switch block further comprises a driving block connected to the gate terminals of the pass-transistors and a body biasing block connected to the body terminal of the NMOS transistor of the second inverter.

20. The switch block according to claim 19 wherein the body biasing block comprises a first and a second biasing transistors, having their gate terminals connected to the driving block.

21. The switch block according to claim 20 wherein the first and second biasing transistors are high voltage transistors.

22. The switch block according to claim 21 wherein the high swing logic is connected between the first voltage reference and the negative voltage reference and comprises:
a first and a second PMOS swing transistors inserted, in parallel to each other, between the first voltage reference and a first node, the first PMOS swing transistor having a gate terminal connected to a first line and the second PMOS swing transistor having a gate terminal connected to a second line;
a first and a second NMOS swing transistors, inserted, in series to each other, between a second node and the negative voltage reference, the first NMOS swing transistor having a gate terminal connected to the first line and the second NMOS swing transistor having a gate terminal connected to the second line; and
a third and a fourth NMOS swing transistors, inserted, in series to each other, between the first and the second nodes, the third swing transistor having a gate terminal connected to the second voltage reference, and the fourth NMOS swing transistor having a gate terminal receiving a voltage value equal to the sum of the first voltage reference and of the negative voltage reference.

23. The switch block according to claim 22 wherein the first and second PMOS swing transistors, as well as the third NMOS swing transistor have their bulk terminals connected to the first voltage reference, while the first and second NMOS swing transistors, as well as the fourth NMOS swing transistor have their bulk terminals connected to the negative voltage reference.

24. The switch block according to claim 22 wherein the first and second PMOS swing transistors as well as the first M11 and second NMOS swing transistors are high voltage transistors, while the third and fourth NMOS swing transistors are low-voltage transistors.

25. The switch block according to claim 20 wherein the first and second biasing transistors are alternatively turned on.

26. The switch block according to claim 25 wherein the second bias transistor is on when the switch block is on.

27. The switch block according to claim 25 wherein the first bias transistor is on and biases a bulk terminal of the NMOS transistor of the second inverter to a negative voltage.

28. The switch block according to claim 19 wherein:
the first biasing transistor is connected between the body terminal of the NMOS transistor of the second inverter and a negative voltage reference and has its body terminal connected to the negative voltage reference and to the body terminal of the second bias transistor; and
the second bias transistor is connected between a body terminal of the NMOS transistor of the second inverter and the second voltage reference.

29. The switch block according to claim 19 wherein the PMOS transistor of the first inverter is a high voltage transistor.

30. The switch block according to claim 19, further comprising:
a pull up transistor inserted between the first voltage reference and the first internal node; and
a further pull up transistor inserted between the first voltage reference and the first internal node
the pull up transistor having its gate terminal connected to the second internal node,
wherein the pull up transistors are high-voltage transistors.

31. The switch block according to claim 19 wherein the driving block is realized by a SRAM cell connected between the first and the negative voltage reference and comprising:
a first block inserted between the first voltage reference and a first output terminal; and
a second block, in turn inserted between the first output terminal and the negative voltage reference;
the first and second blocks being also connected to each other and to an input terminal, in turn connected to a write transistor
wherein the first block comprises a first and a second PMOS transistors as well as a first and a second NMOS transistors and the second block comprises a third and a fourth NMOS transistors as well as a fifth and a sixth NMOS transistors.

32. The switch block according to claim 31 wherein the first and second PMOS transistors of the first block, as well as the third and fourth NMOS transistors of the second block are high-voltage transistors; and the first and second NMOS transistors of the first block as well as the fifth and sixth NMOS transistors of the second block are low-voltage transistors.

33. The switch block according to claim 31 wherein the first PMOS transistor and the first NMOS transistor of the first block are inserted, in series to each other, between the first voltage reference and the input terminal and have their bulk terminals connected to the first voltage reference, the first PMOS transistor having a gate terminal connected to a second output terminal; and the second PMOS transistor and the second NMOS transistor of the first block are inserted, in series to each other, between the first voltage reference and the first output terminal and have their bulk terminals connected to the first voltage reference, the second PMOS transistor having a gate terminal connected to a common drain terminals of the first PMOS transistor and of the first NMOS transistor, the first and second NMOS transistors having their gate terminals connected to each other and to the second voltage reference.

34. The switch block according to claim 31 wherein the third and the fifth NMOS transistors of the second block are inserted, in series to each other, between the input terminal and the negative voltage reference and have their bulk terminals connected to the negative voltage reference, the third NMOS transistor having a gate terminal connected to a third output terminal; and the fourth and the sixth NMOS transistors of the second block are inserted, in series to each other, between the first output terminal and the negative voltage reference and have their body terminals connected to the negative voltage reference, the fourth NMOS transistor having a gate terminal connected to a fourth output terminal and the fifth and sixth NMOS transistors having their gate terminals connected to each other and receiving a voltage value equal to the sum of the first voltage reference and of the negative voltage reference.

35. The switch block according to claim 31 wherein the SRAM cell is connected to a high swing logic.

36. A switch block connecting a first, second, third and fourth lines and comprising:
   a first pass-transistor connected between the first line and an input internal node;
   a second pass-transistor connected between the second line and the input internal node;
   a third pass-transistor connected between the third line and the input internal node;
   a fourth pass-transistor connected to the fourth line;
   first and a second inverters inserted between a first internal node and the fourth line and interconnected at a second internal node;
   the first inverter comprising a PMOS transistor and an NMOS transistor connected; in series to each other and between the first and second voltage references, the transistors of the first inverter having their gate terminals connected to each other and to a first internal node and common drain terminals connected to the second internal node;
   the second inverter comprising a PMOS transistor and an NMOS transistor connected, in series to each other, between the first and second voltage references, the transistors of the second inverter having their gate terminals connected to each other and to the second internal node wherein the NMOS transistor of the second inverter is directly connected to a first conduction terminal of the fourth pass-transistor and to the fourth line and the PMOS transistor of the second inverter is connected to a second conduction terminal of the fourth pass-transistor; and
   wherein the switch block further comprises an additional input transistor inserted between an internal input node and the first internal node.

37. The switch block according to claim 36 wherein the gate terminals of the pass-transistors and of the additional input transistor are connected to a driving block providing a voltage signal having a value between a negative voltage value and a value equal to the first voltage reference.

38. The switch block according to claim 36 wherein the PMOS transistor of the first inverter and the NMOS transistor of the second inverter are high-voltage transistors.

39. The switch block according to claim 36, further comprising:
   a pull up transistor inserted between the first voltage reference and the first internal node; and
   a further pull up transistor inserted between the first voltage reference and the first internal node
   the pull up transistor having its gate terminal connected to the second internal node,
   wherein the pull up transistors are high-voltage transistors.

40. The switch block according to claim 36 wherein the additional input transistor is off and the switch block propagates a signal between two lines by turning on at least two of the input pass-transistors to implement an unbuffered connection.

* * * * *

UNITED STATES PATENT AND TRADEMARK OFFICE
CERTIFICATE OF CORRECTION

| | |
|---|---|
| PATENT NO. | : 7,463,067 B2 |
| APPLICATION NO. | : 11/537781 |
| DATED | : December 9, 2008 |
| INVENTOR(S) | : Luca Ciccarelli et al. |

It is certified that error appears in the above-identified patent and that said Letters Patent is hereby corrected as shown below:

Column 20
Line 12, "between the first voltage reference and a fourth internal" should read as
-- between a first voltage reference and a fourth internal --

Line 53, "first and a second inverters inserted between the first" should read as -- first and second inverters inserted between the first --

Line 58, "between the first and second voltage references," should read as -- between first and second voltage references, --

Line 67, "connected to each other and to the second internal node" should read as
-- connected to each other and to the second internal node, --

Column 21
Lines 8-11, "a pull up transistor inserted between the first voltage reference and the first internal node; and a further pull up transistor inserted between the first voltage reference and the first internal node" should read as -- a pull up transistor inserted between the first voltage reference and the first internal node; a further pull up transistor inserted between the first voltage reference and the first internal node; and --

Line 24, "a first and a second inverters, inserted between the first" should read as
-- a first and a second inverter, inserted between the first --

Line 29, "between the first voltage reference and a third internal" should read as
-- between a first voltage reference and a third internal --

Line 33, "internal node;" should read as -- internal node; and --

Line 39, "internal node" should read as -- internal node, --

Line 43, "fourth pass-transistor and" should read as -- fourth pass-transistor, and --

UNITED STATES PATENT AND TRADEMARK OFFICE
CERTIFICATE OF CORRECTION

| | | |
|---|---|---|
| PATENT NO. | : 7,463,067 B2 | |
| APPLICATION NO. | : 11/537781 | |
| DATED | : December 9, 2008 | |
| INVENTOR(S) | : Luca Ciccarelli et al. | |

It is certified that error appears in the above-identified patent and that said Letters Patent is hereby corrected as shown below:

Column 21
Lines 48-51, "a pull up transistor inserted between the first voltage reference and the first internal node; and a further pull up transistor inserted between the first voltage reference and the first internal node" should read as -- a pull up transistor inserted between the first voltage reference and the first internal node; a further pull up transistor inserted between the first voltage reference and the first internal node; and --

Column 22
Line 13, "between the first voltage reference and a third internal" should read as -- between a first voltage reference and a third internal --

Line 23, "internal node" should read as -- internal node, --

Lines 43-46, "a pull up transistor inserted between the first voltage reference and the first internal node; and a further pull up transistor inserted between the first voltage reference and the first internal node" should read as -- a pull up transistor inserted between the first voltage reference and the first internal node; a further pull up transistor inserted between the first voltage reference and the first internal node; and --

Line 62, "a first and a second inverters, inserted between the first" should read as -- a first and a second inverter, inserted between the first --

Line 67, "between the first and second voltage references," should read as -- between first and second voltage references, --

Column 23
Line 4, "internal node;" should read as -- internal node; and --

Line 19, "connected to each other and to the second internal node" should read as -- connected to each other and to the second internal node, --

Lines 26-28, "The switch block according to claim 22 wherein the high swing logic is connected between the first voltage reference and the negative voltage reference and comprises:" should read as -- The switch block according to claim 22 wherein a high swing logic is connected between the first voltage reference and a negative voltage reference and comprises: --

UNITED STATES PATENT AND TRADEMARK OFFICE
CERTIFICATE OF CORRECTION

PATENT NO. : 7,463,067 B2
APPLICATION NO. : 11/537781
DATED : December 9, 2008
INVENTOR(S) : Luca Ciccarelli et al.

It is certified that error appears in the above-identified patent and that said Letters Patent is hereby corrected as shown below:

Column 23
Line 29, "a first and a second PMOS swing transistors inserted, in" should read as -- a first and a second PMOS swing transistor inserted, in --

Line 35, "a first and a second NMOS swing transistors inserted, in" should read as -- a first and a second NMOS swing transistor inserted, in --

Line 41, "a third and a fourth NMOS swing transistors inserted, in" should read as -- a third and a fourth NMOS swing transistor inserted, in --

Line 44, "connected to the second voltage reference," should read as -- connected to a second voltage reference, --

Line 58, "M11 and the second NMOS swing transistors are high voltage" should read as -- and the second NMOS swing transistors are high voltage --

Column 24
Line 1, "The switch block according to claim 19 wherein:" should read as -- The switch block according to claim 20 wherein: --

Lines 15-18, "a pull up transistor inserted between the first voltage reference and the first internal node; and a further pull up transistor inserted between the first voltage reference and the first internal node" should read as -- a pull up transistor inserted between the first voltage reference and the first internal node; a further pull up transistor inserted between the first voltage reference and the first internal node; and --

Line 55, "terminals of the first PMOS transistor and of the first NMOS" should read as -- terminal of the first PMOS transistor and of the first NMOS --

Column 25
Line 11, "fourth lines and comprising:" should read as -- fourth line and comprising: --

UNITED STATES PATENT AND TRADEMARK OFFICE
CERTIFICATE OF CORRECTION

PATENT NO. : 7,463,067 B2
APPLICATION NO. : 11/537781
DATED : December 9, 2008
INVENTOR(S) : Luca Ciccarelli et al.

It is certified that error appears in the above-identified patent and that said Letters Patent is hereby corrected as shown below:

Column 25
Line 19, "first and a second inverters inserted between a first internal" should read as
-- first and second inverters inserted between a first internal --

Line 23, "NMOS transistor connected; in series to each other and" should read as
-- NMOS transistor connected in series to each other and --

Line 33, "connected to each other and to the second internal node" should read as
-- connected to each other and to the second internal node; --

Column 26
Line 20-23, "a pull up transistor inserted between the first voltage reference and the first internal node; and a further pull up transistor inserted between the first voltage reference and the first internal node" should read as -- a pull up transistor inserted between the first voltage reference and the first internal node; a further pull up transistor inserted between the first voltage reference and the first internal node; and --

Signed and Sealed this

Twenty-fourth Day of March, 2009

JOHN DOLL
*Acting Director of the United States Patent and Trademark Office*